United States Patent
Maeda et al.

(10) Patent No.: US 7,711,526 B2
(45) Date of Patent: May 4, 2010

(54) SIMULATOR AND PARAMETER EXTRACTION DEVICE FOR TRANSISTOR, SIMULATION AND PARAMETER EXTRACTION METHOD FOR TRANSISTOR, AND ASSOCIATED COMPUTER PROGRAM AND STORAGE MEDIUM

(75) Inventors: Kazuhiro Maeda, Soraku-Gun (JP); Tamotsu Sakai, Ikoma (JP); Yasushi Kubota, Sakurai (JP); Shigeki Imai, Nara (JP); Kenshi Tada, Tenri (JP); Kenji Taniguchi, Suita (JP)

(73) Assignee: Sharp Kabushiki Kaisha, Osaka (JP)

( * ) Notice: Subject to any disclaimer, the term of this patent is extended or adjusted under 35 U.S.C. 154(b) by 599 days.

(21) Appl. No.: 10/891,083

(22) Filed: Jul. 15, 2004

(65) Prior Publication Data

US 2005/0015235 A1    Jan. 20, 2005

(30) Foreign Application Priority Data

Jul. 16, 2003    (JP)    ............................. 2003-197902

(51) Int. Cl.
G06F 7/60    (2006.01)
G06G 7/62    (2006.01)

(52) U.S. Cl. ............................................ 703/2; 703/13

(58) Field of Classification Search ................ 703/13, 703/2
See application file for complete search history.

(56) References Cited

U.S. PATENT DOCUMENTS 6,373,274 B1 *    4/2002    Yamaguchi ................. 324/769
6,407,573 B1 *    6/2002    Yamaguchi et al. ......... 324/769
6,649,430 B2 *    11/2003    Yamaguchi ................. 438/17
6,714,027 B1 *    3/2004    Lui et al. .................... 324/719

(Continued)

FOREIGN PATENT DOCUMENTS

JP    7-176740 A    7/1995

(Continued)

OTHER PUBLICATIONS

Oh et al., A Bias Dependent Source/Drain Resistance Model in LDD MOSFET Devices for Distortion Analysis, Oct. 1999, ICVC '99, Seoul, South Korea, pp. 190-193.*

(Continued)

*Primary Examiner*—Paul L Rodriguez
*Assistant Examiner*—Juan C Ochoa
(74) *Attorney, Agent, or Firm*—Birch, Stewart, Kolasch & Birch, LLP

(57) ABSTRACT

A transistor model for a simulator simulates a resistance between a source region and a drain region with a model equation which has terms representing resistance values corresponding respectively to areas of mutually different impurity concentrations below a gate section in simulating characteristics of a transistor. At least two of the terms each having a threshold parameter indicating a voltage at which a semiconductor element composed of the associated region and regions adjacent to that region changes from an ON state to an OFF state. The threshold parameters of the terms being specified independently from each other. Thus, the characteristics of a transistor having a set of areas of mutually different impurity concentrations below a gate section, inclusive of subthreshold regions which are difficult to evaluate through actual measurement, can be simulated to high accuracy while preserving a good fit with a capacitance model.

27 Claims, 21 Drawing Sheets

U.S. PATENT DOCUMENTS

| | | | |
|---|---|---|---|
| 6,735,558 B1 * | 5/2004 | Yamaguchi | 703/14 |
| 6,898,561 B1 * | 5/2005 | Liu et al. | 703/14 |
| 2001/0026192 A1 * | 10/2001 | Yamamoto | 330/253 |
| 2002/0127749 A1 * | 9/2002 | Yamaguchi | 438/18 |
| 2002/0130679 A1 * | 9/2002 | Yamaguchi | 324/769 |
| 2003/0082839 A1 | 5/2003 | Kitamaru et al. | |
| 2005/0086014 A1 | 4/2005 | Kitamaru et al. | |

FOREIGN PATENT DOCUMENTS

| | | |
|---|---|---|
| JP | 2699844 B2 | 9/1997 |
| JP | 2003-77934 A | 3/2003 |

OTHER PUBLICATIONS

Yuh-Sheng Jean and Ching-Yuan Wu, A New Extraction Algorithm for the Metallurgical Channel Length of Conventional and LDD MOSFETs, Jun. 1996, IEEE Transactions on Electron Devices, vol. 43, Issue 6, pp. 946-953.*

Tada et al. "Novel method of intrinsic characteristics extraction in LDD MOSFETs for accurate device modeling", Journal of Applied Physics, vol. 43, No. 3, 2004, pp. 1-31.

* cited by examiner

Lp/Wp : 2um/10um
Ln/Wn : 2um/5um
Cl     : 1pF
Vdd    : 5V
Time   : 1usec

SIMULATOR AND PARAMETER EXTRACTION DEVICE FOR TRANSISTOR, SIMULATION AND PARAMETER EXTRACTION METHOD FOR TRANSISTOR, AND ASSOCIATED COMPUTER PROGRAM AND STORAGE MEDIUM

This Nonprovisional application claims priority under 35 U.S.C. §119(a) on Patent Application No. 2003/197902 filed in Japan on Jul. 16, 2003, the entire contents of which are hereby incorporated by reference.

FIELD OF THE INVENTION

The present invention relates to a transistor simulator, a transistor parameter extraction device, a transistor simulation method, a transistor parameter extraction method, and an associated computer program and a storage medium.

BACKGROUND OF THE INVENTION

Simulators have been in widespread use which simulate the characteristics of transistors by evaluating model equations, many of which assume that there extend a single resistance region below the gate section of the transistor.

An example of such a model equation is:

$$Vd/Id = Leff/[Weff \cdot \mu \cdot Cox \cdot (Vg-Vt-Vd/2)] + R \quad (1)$$

where Vd is the source-to-drain voltage, Id the source-to-drain current, Vg the gate-to-source voltage, R the resistance value of a part of source and drain regions which are not under a gate electrode, Weff the effective gate width of the transistor, Cox the capacitance density of the transistor's gate oxide film, $\mu$ the mobility of moving carriers, and Leff the effective channel length.

This model equation assumes that there exist a single resistance region below the gate section of the transistor, as is the case with the transistor 121 shown in FIG. 6. The equation is thus capable of simulating the characteristics of the transistor (first transistor) to high accuracy. However, with the equation, one cannot readily carry out a accurate characteristics simulation for a transistor (second transistor) in which there exist multiple impurity concentration regions below the gate section. An example of such a transistor is shown in FIG. 2. Designated by 101, the transistor includes impurity regions below its gate section at lower concentrations than in the source and drain sections. No such impurity regions are included in the first transistor.

FIGS. 24, 25 represent results of extraction of a transconductance gm using model equation (1) for the first and second transistors respectively. In each case, the extraction was conducted on samples varying from L1 to L5 in gate length at a gate voltage Vg, by extracting an R value from the characteristics of the individual sample using equation (1) and then calculating ideal transistor characteristics under no influence of the R using equation (1). In the figures, the transconductances gm are normalized by their maximum value gmax. A comparison of the figures clearly demonstrates that the normalized gm characteristics are substantially identical between different gate lengths similarly to actual characteristics in FIG. 24 representing the extraction results for the first transistor, whereas in FIG. 25 representing the extraction results for the second transistor, the normalized gm characteristics vary with gate length unlike actual characteristics.

To simulate the characteristics of the second transistor to high accuracy using model equation (1), for example, an analytical equation reflecting structure dependence may be expediently added to the original model equation assuming a moving carrier mobility of $\mu$. The resultant model equation simulates a different moving carrier mobility $\mu$ from the first transistor. This alternative equation however is more complicated.

In addition, with alternative model equations simulating a different moving carrier mobility $\mu$ from the first transistor, parameter extraction is difficult and simulatable gate length ranges are narrower, because the model equations disregards the physical fact that the first and second transistors have the same moving carrier mobility, except in the impurity concentration regions found in the second transistor, but not in the first transistor.

Japanese patent 2699844 (registered Sep. 26, 1997; see equations (8), (19), and (20)) discloses a simulator simulating the characteristics of a transistor by equation (2):

$$Vd/Id = L/[Weff \cdot \mu \cdot Cox \cdot (Vg-Vt)] - l_0/[Weff \cdot \mu \cdot Cox \cdot (Vg-Vt)] + R \quad (2)$$

The equation aims a accurate simulation of the characteristics of a transistor having impurity regions below its gate section at lower concentrations than in the source and drain sections. In equation (2), L is the gate length. Also, $l_0$ is an overlap length of a gate diffusion layer. With model parameters LO, LA, LB and an effective gate voltage Vge, equations (3), (4) hold:

$$l_0 = LO + LA \cdot (1 - Vge/LB)^2 \text{ when } Vge < LB \quad (3)$$

$$l_0 = LO \text{ when } Vge \geq LB \quad (4)$$

However, in the above-described conventional art, the resistance in a region where the actual resistance value varies with gate voltage is adjusted depending on the length of the region. The approach will result in departure from the physical model when it involves an increased number of parameters being determined empirically. Thus, the approach poorly matches capacitance models based on the behavior of surface charge in the channel section and renders it difficult to improve the fitting accuracy of simulation where evaluation through actual measurement is difficult, as in subthreshold regions.

SUMMARY OF THE INVENTION

Disclosed herein is a simulator which, despite the fact that a transistor including regions of mutually different impurity concentrations below its gate section is the simulation target, can simulate the characteristics of a transistor, inclusive of subthreshold regions which are difficult to evaluate through actual measurement, to high accuracy while preserving a good fit with a capacitance model, and also to provide a parameter extraction device, a simulation method, and a parameter extraction method for the simulator, as well as a computer program implementing the method and a storage medium containing the program.

The disclosed simulator includes a transistor characteristics calculation section calculating, from predetermined model equations, characteristics of a transistor including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:

one of the model equations which represent a resistance between a source section electrode and a drain section electrode has terms representing resistance values corresponding respectively to the regions;

at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and the threshold parameters of the terms are specified independently from each other.

The foregoing or following threshold parameters may be single parameters directly indicating a transition voltage or a set of parameters dictating the voltage, provided that the parameter(s) indicates a transition voltage.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. The independent terms enable independent evaluation of the resistance value of the primary factor region and those of the parasitic resistance regions.

In addition, the threshold parameters correspond to physical quantities of the simulation target transistor and indicate a transition voltage at which the semiconductor element changes from a state where the element exhibits such a low conductance that a resistance of the associated region varies exponentially with the gate voltage to a state where the element exhibits such a high conductance that the resistance of the associated region varies with the gate voltage more moderately than exponential variations.

As a result, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model. In addition, the characteristics of the transistor are simulated using a model equation including threshold parameters which has physical meanings; therefore, parameters can highly accurately be extracted from the measurements of the characteristics of the simulation target transistor.

The disclosed parameter extraction device includes a parameter extraction section extracting a parameter to calculate, from predetermined model equations, characteristics of a transistor including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:

one of the model equations which represents a resistance between a source section electrode and a drain section electrode has terms representing resistance values corresponding respectively to the regions;

at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and the threshold parameters of the terms are specified independently from each other, wherein the parameter extraction section measures characteristics of a capacitance between a first terminal connected to a gate section electrode of the transistor and a second terminal commonly connected to the source section electrode and the drain section electrode with respect to the gate voltage, and calculates the threshold parameters on the basis of the measurements.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. Therefore, by the simulation of a transistor with the model equation, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model.

In addition, the parameter extraction device extracts threshold parameters on the basis of the characteristics of the capacitance of a transistor with respect to the gate voltage; therefore, a single measurement of the characteristics of the capacitance with respect to the gate voltage can extract all the threshold parameters, regardless of the number of threshold parameters. Therefore, the threshold parameters included in the model equation which can simulate the characteristics of a transistor to high accuracy can readily be extracted.

Also disclosed is a transistor simulation method that includes the transistor characteristics calculation step of calculating, from predetermined model equations, characteristics of a transistor including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:

one of the model equations which represents a resistance between a source section electrode and a drain section electrode has terms representing resistance values corresponding respectively to the regions;

at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and the threshold parameters of the terms are specified independently from each other.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. Therefore, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model.

A parameter extraction method is disclosed that includes the parameter extraction step of extracting a parameter to calculate, from predetermined model equations, characteristics of a transistor including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:

one of the model equations which represents a resistance between a source section electrode and a drain section electrode has terms representing resistance values corresponding respectively to the regions;

at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and the threshold parameters of the terms are specified independently from each other, wherein the parameter extraction step includes the steps of measuring characteristics of a capacitance between a first terminal connected to a gate section electrode of the transistor and a second terminal commonly connected to the source section electrode and the drain section electrode with respect to the gate voltage, and calculating the threshold parameters on the basis of the measurements.

According to the arrangement, the threshold parameters are extracted on the basis of the characteristics of the capacitance of a transistor with respect to the gate voltage; therefore, a single measurement of the characteristics of the capacitance with respect to the gate voltage can extract all the threshold parameters, regardless of the number of threshold parameters. Therefore, the threshold parameters included in the model equation which can simulate the characteristics of a transistor to high accuracy can readily be extracted.

For a fuller understanding of the nature and advantages of the invention, reference should be made to the ensuing detailed description taken in conjunction with the accompanying drawings.

DESCRIPTION OF THE EMBODIMENTS

Embodiment 1

The following will describe an embodiment of the present invention with reference to FIGS. 1 through 20. A simulation system (simulator) 1 in accordance with the present embodiment is capable of simulate the characteristics of a field effect transistor 2 to high accuracy. The transistor 2 includes regions of different resistance values below its gate section.

The field effect transistor 2 which is a simulation target for the simulation system 1 ("transistor 2") may be of any structure as long as it has regions of different resistance values below its gate section. The following description will assume, as an example, that the transistor 2 be a thin film transistor fabricated on glass or another insulating substrate.

Figure 2:
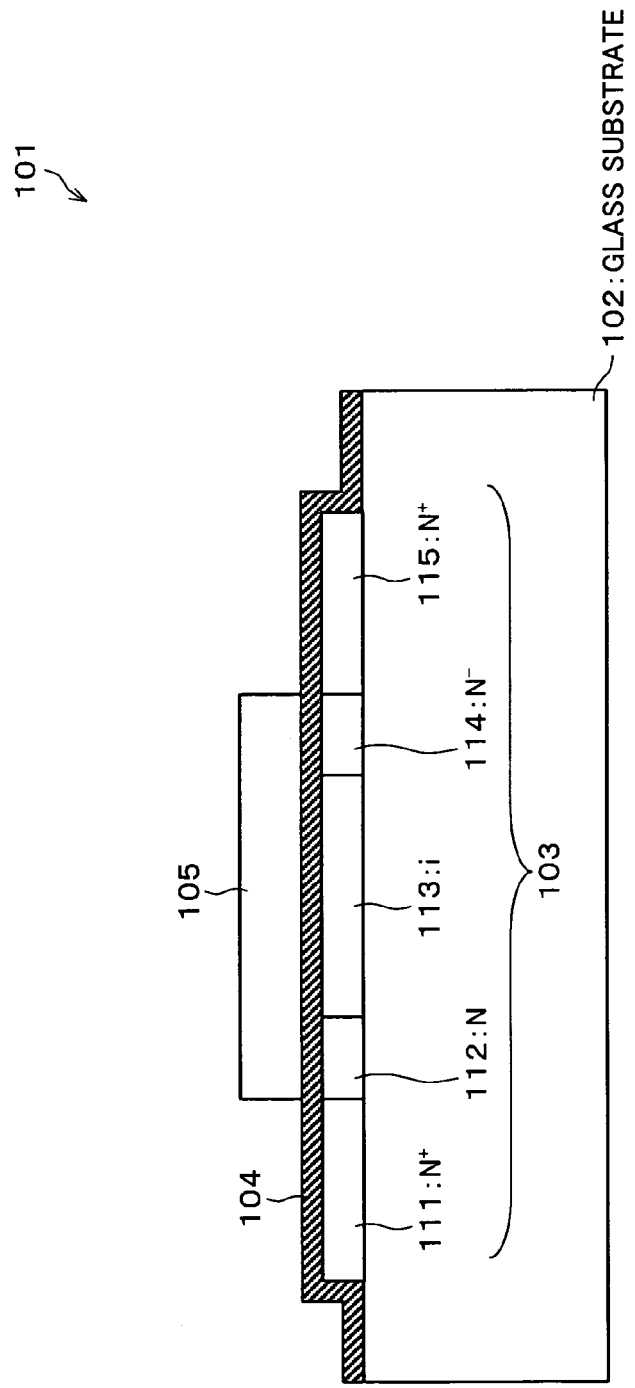
FIG. 2 is a cross-sectional view of the structure of a transistor which is a simulation target for the simulation system.

A thin film transistor 101 includes a thin film (e.g. polycrystalline silicon thin film) formed on an insulating substrate as an active layer, and includes a semiconductor thin film 103 on an insulating substrate 102 with a silicon oxide film (not shown) intervening therebetween as shown in, for example, FIG. 2. For example, when the substrate 102 needs to be transparent for a specific purpose (e.g., as an active matrix substrate in an image display), the substrate 102 is preferably fabricated from, for example, a glass substrate. The semiconductor thin film 103 is, for example, made of polycrystalline silicon.

The semiconductor thin film 103 is divided into regions 111 to 115 sitting side by side in this order. The region 113 is composed of intrinsic semiconductor, hence designated "i." The other regions, 111, 112, 114, 115 are of a first conduction type (e.g. N). The regions 111, 115 have a higher impurity concentration than the regions 112, 114; hence, the former are designated "N+" and the latter "N−."

On the intrinsic region 113 (opposite to the substrate 102) is there provided a gate electrode 105 with the silicon oxide film (gate oxide film) 104 intervening therebetween. A silicon oxide film (not shown) covers the film 104 and the electrode 105, providing protection. In this structure, the entire gate section is made of metal, forming the gate electrode 105.

The N+ regions 111, 115 are connected respectively to a source section electrode and a drain section electrode (neither shown) to act respectively as a source region and a drain region. The intrinsic region 113, the N− regions 112, 114, and parts of the N+ regions 111, 115 provide a drain current path between the source and drain regions.

In the thin film transistor 101 thus constructed, the intrinsic region 113, the N− regions 112, 114, and parts of the N+ regions 111, 115, all located below the gate electrode 105 (between the electrode 105 and the substrate 102), differ from each other in impurity concentration, hence in resistance properties.

The simulation system 1 in accordance with the present embodiment involves a model equation which simulates the resistance value between the source and drain regions, more specifically, the resistance value Rds between the source section electrode and the drain section electrode. The model equation includes terms which give resistance values corresponding to the associated regions with mutually different impurity concentrations below the gate electrode 105. At least two of the terms include a threshold parameter indicating a voltage value where the semiconductor element formed by the associated region and its adjacent region(s) changes from ON state to OFF state, more specifically, indicating a transition voltage at which the semiconductor element changes from a state where the element exhibits such low conductance that the resistance of the region varies exponentially with gate voltage to a state where the element exhibits such high conductance that the resistance of the region varies with gate voltage more moderately than exponential variations. The threshold parameters in the terms are set independently from each other.

Specifically, when the thin film transistor 101 in FIG. 2 is the "simulation target" transistor 2, three regions with different impurity concentrations are formed below the gate electrode 105: the N− region 112 ($A_1$), intrinsic region 113 ($A_2$), and N− region 114 ($A_3$).

Therefore, the simulation system 1 models the resistance Rds between the source section electrode and the drain section electrode by equation (5):

$$Rds = Vd/Id \quad (5)$$
$$= L_1/\{(W_1 \cdot \mu_1 \cdot Cox_1)(Vg - Vt_1)\} +$$
$$L_2/\{(W_2 \cdot \mu_2 \cdot Cox_2)(Vg - Vt_2)\} +$$
$$L_3/\{(W_3 \cdot \mu_3 \cdot Cox_3)(Vg - Vt_3)\} + R$$

Parameters are given the same suffixes as their corresponding regions $A_1$ to $A_3$ in the equation.

In equation (5), Vd is a source-to-drain voltage, Id the source-to-drain current, Vg the gate-to-source voltage, and R the resistance value between the source and drain regions which are not below the gate electrode 105. With a suffix "i" indicating either of the regions, $L_i$ is the length of the region $A_i$ in the source-drain direction, and $\mu_i$ is the moving carrier mobility in the region $A_i$. $W_i$ is the width of the region $A_i$, equaling the effective gate width Weff of the transistor 2 in many cases. $Cox_i$ is the oxide film capacitance density in the region $A_i$, which is the oxide film permittivity divided by the oxide film thickness. $Cox_i$ in many cases are equal to the oxide film capacitance density Cox of the gate oxide film 104 in the transistor 2.

Still referring to equation (5), $Vt_i$ is a threshold parameter for the region $A_i$, representing a voltage value at which a semiconductor element composed of the region $A_i$ and its adjacent regions $A_{(i-1)}$, $A_{(i+1)}$ change from an ON state to an OFF state. When the region $A_i$ is adjacent to the N+ region 111 forming the source region or the N+ region 115 forming the drain region, the semiconductor element may be composed of the region $A_i$ and the N+ region 111 forming the source region or the N+ region 115 forming the drain region, instead of $A_{(i-1)}$ or $A_{(i+1)}$.

Using $\gamma_i = L_i/(W_i \cdot \mu_i \cdot Cox_i)$, equation (5) becomes:

$$Rds = Vd/Id = \gamma_1/(Vg-Vt_1) + \gamma_2/(Vg-Vt_2) + \gamma_3/(Vg-Vt_3) + R \quad (6)$$

In the case of the transistor 2 in FIG. 2, the regions below the gate electrode 105 are three: the N− region 112 ($A_1$), the intrinsic region 113 ($A_2$), and the N− region 114 ($A_3$). Since the N− regions 112, 114 have equal impurity concentrations, the N− regions 112, 114 have equal threshold parameters $Vt_1$, $Vt_3$ and equal moving carrier mobilities $\mu_1$, $\mu_3$. Therefore, the N− regions 112, 114 can be reduced to a single term, using "$L_i$" referring to the sum of the lengths of the W regions 112, 114 in the source-drain direction.

Thus, rearranging equation (5), equation (7) is obtained:

$$Vd/Id = Lch/[(Weff \cdot \mu \cdot Cox) \cdot (Vg-Vt)] + L_{LDD}/$$
$$[(Weff \cdot \mu_{LDD} \cdot Cox) \cdot (Vg-Vt_{LDD})] + R \quad (7)$$

wherein Lch is the effective length of the intrinsic region 113 in the source-drain direction, $L_{LDD}$ the sum of the effective lengths of the N⁻ regions 112, 114 in the source-drain direction, μ and $μ_{LDD}$ the moving carrier morbidities of the intrinsic region 113 and the N⁻ regions 112, 114, and Vt and $Vt_{LDD}$ the threshold parameters of the intrinsic region 113 and the N⁻ regions 112, 114. The effective length Lch=L−Loff, wherein L is the ideal length of the intrinsic region 113 in the source-drain direction, and Loff the offset length from the ideal length L.

Rearranging equation (6) using γ=Lch/(Weff·μ·Cox), $γ_{LDD}=L_{LDD}/(Weff·μ_{LDD}·Cox)$, equation (8) is obtained:

$$Vd/Id=γ/(Vg-Vt)+γ_{LDD}/(Vg-Vt_{LDD})+R \qquad (8)$$

As described above, the simulation system 1 in accordance with the present embodiment is a system aimed at simulating the transistor 2 which includes regions $A_i$ each having a different impurity concentration from the others below the gate electrode 105, and do so by a model equation. The model equation includes terms giving resistance values corresponding to the associated regions. At least two of the terms include a threshold parameter indicating a transition voltage at which the semiconductor element composed of the associated region and its adjacent regions changes from a state where the element exhibits such low conductance that the resistance value of that region varies exponentially with gate voltage to a state where the element exhibits such high conductance that the resistance of the region varies with gate voltage more moderately than exponential variations. The threshold parameter in the terms are set independently from each other.

According to the configuration, when regarding the channel region as a primary factor in resistance variations between the source section electrode and the drain section electrode of the transistor 2 and the other regions as providing parasitic resistance, the terms corresponding respectively to the primary factor region and the parasitic resistance regions include threshold parameters which are set independently from each other. The independent terms enable independent evaluation of the resistance value of the primary factor region and those of the parasitic resistance regions.

The threshold parameters have physical meanings to the simulation target transistor 2 and indicate a transition voltage at which the semiconductor element changes from a state where the element exhibits such low conductance that it varies exponentially with gate voltage to a state where the element exhibits such high conductance that it varies with gate voltage more moderately than exponential variations.

As a result of the configuration, despite the fact that the transistor 2 including regions of mutually different impurity concentrations below the gate electrode 105 is the simulation target, the characteristics of the transistor 2, inclusive of sub-threshold regions which are difficult to evaluate, through actual measurement, can be simulated to high accuracy while preserving a good fit with a capacitance model. In addition, the characteristics of the transistor 2 are simulated using the model equation including threshold parameters which has physical meanings; therefore, parameters can highly accurately be extracted from the measurements of the characteristics of the simulation target transistor 2.

Figure 3:
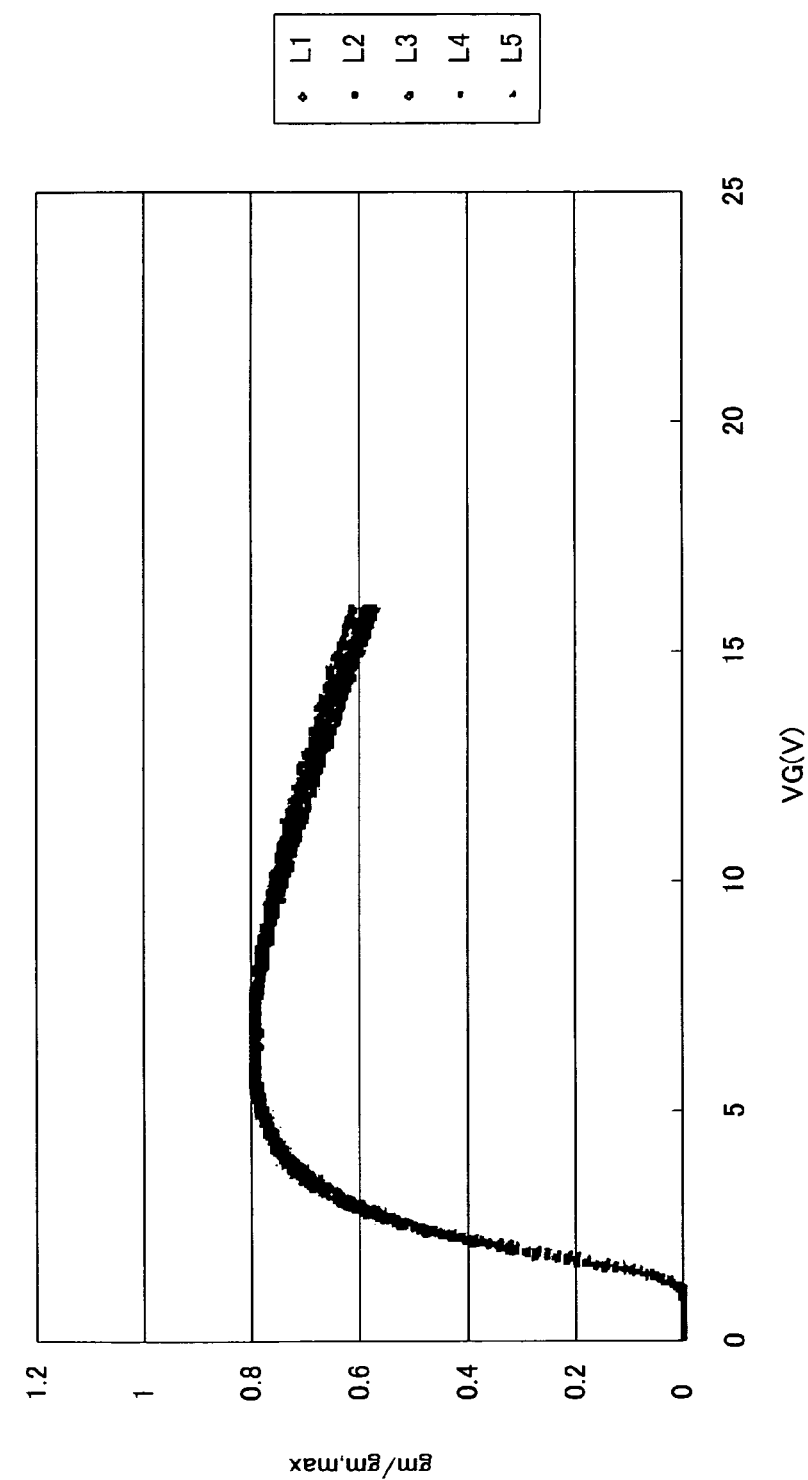
FIG. 3 is a graph representing results of intrinsic gm extraction by the simulation system.

Now, FIG. 3 represents results of extraction of the transconductance gm of an intrinsic semiconductor region (intrinsic region 113) by the simulation system 1. The extraction was conducted, using equation (7) as the model equation, on transistors 101 varying from $L_1$ to $L_5$ in gate length at a gate voltage Vg. More specifically, the simulation system 1 extracted parameters for equation (7) from the measurements of the characteristics of the transistors 101 varying from $L_1$ to $L_5$ in gate length and extracted gm the characteristics of the intrinsic region 113 using equation (7). In FIG. 3, each gm is normalized by its maximum value gmax.

Figure 25:
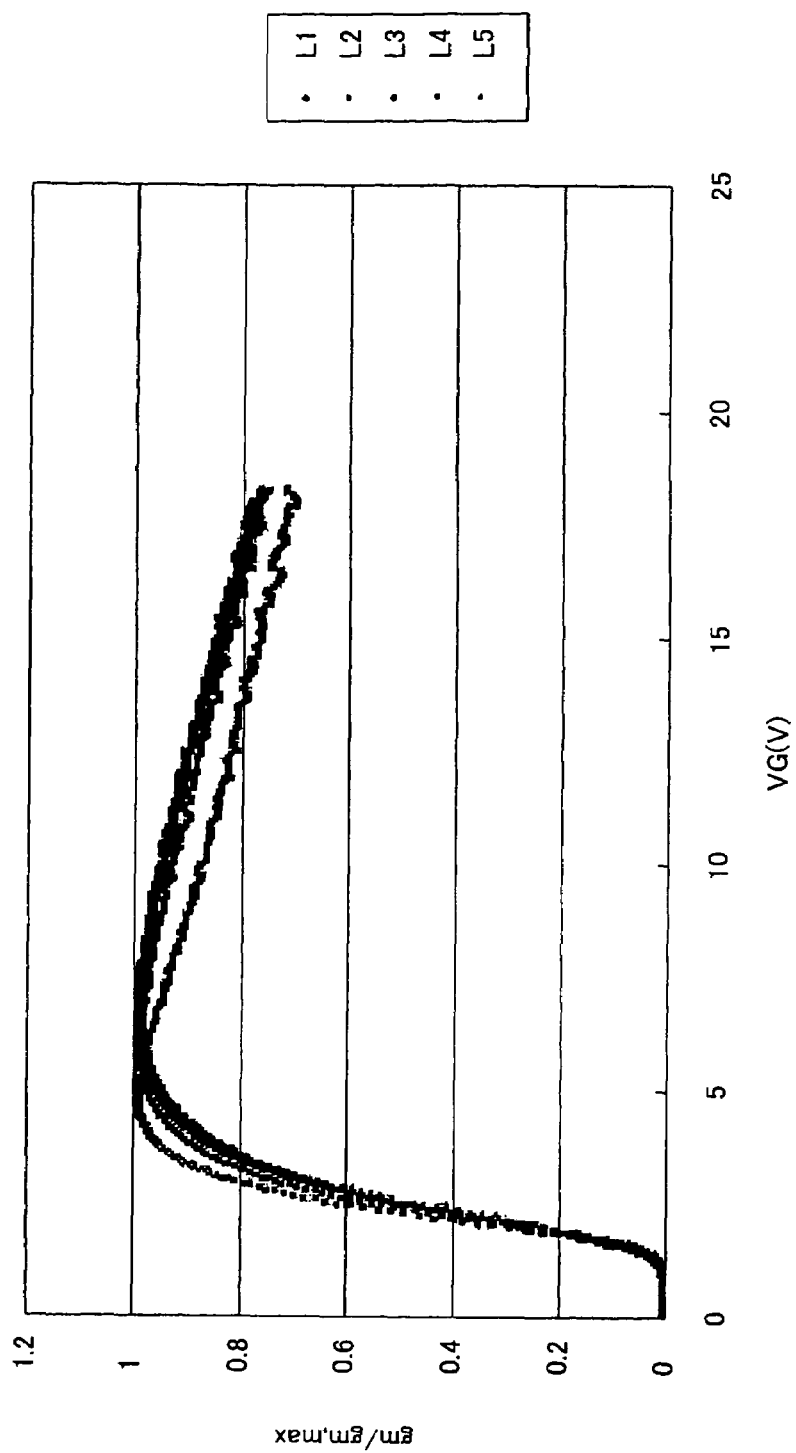
FIG. 25, depicting conventional art, is a graph representing results of extraction of intrinsic gm of a transistor having multiple regions of different impurity concentrations below the gate section using a conventional model equation.

As shown in FIG. 3, in the case of the gm characteristics extracted by the simulation system 1 in accordance with the present embodiment, the normalized gm characteristics are substantially identical between different gate lengths similarly to actual characteristics. This demonstrates that the gm characteristics of the intrinsic region 113 was extracted to high accuracy when compared with a case where equation (1) discussed above is used as the model equation, in other words, where the normalized gm characteristics vary greatly with gate length as shown in FIG. 25 unlike actual characteristics.

In addition, as mentioned earlier, when equation (1) is used as the model equation, an analytical equation indicating structure dependence to be added to the model equation for moving carrier mobility μ needs to be prepared for every structure, in other words, for every gate length. Meanwhile, with the simulation system 1 in accordance with the present embodiment, only those parameters representing a structure need to be altered in equation (7). Therefore, equation (7) applies to different gate lengths, and the high simulation system 1 achieves a high level of accuracy and still offers a high degree of convenience.

Further, the simulation system 1 in accordance with the present embodiment is not only capable of simulating the characteristics of the transistor 2 using equations (5) to (8), but also capable of actually measure the characteristics of the transistor 2 and extracting parameters for the equations from the characteristics of the transistor 2.

Figure 1:
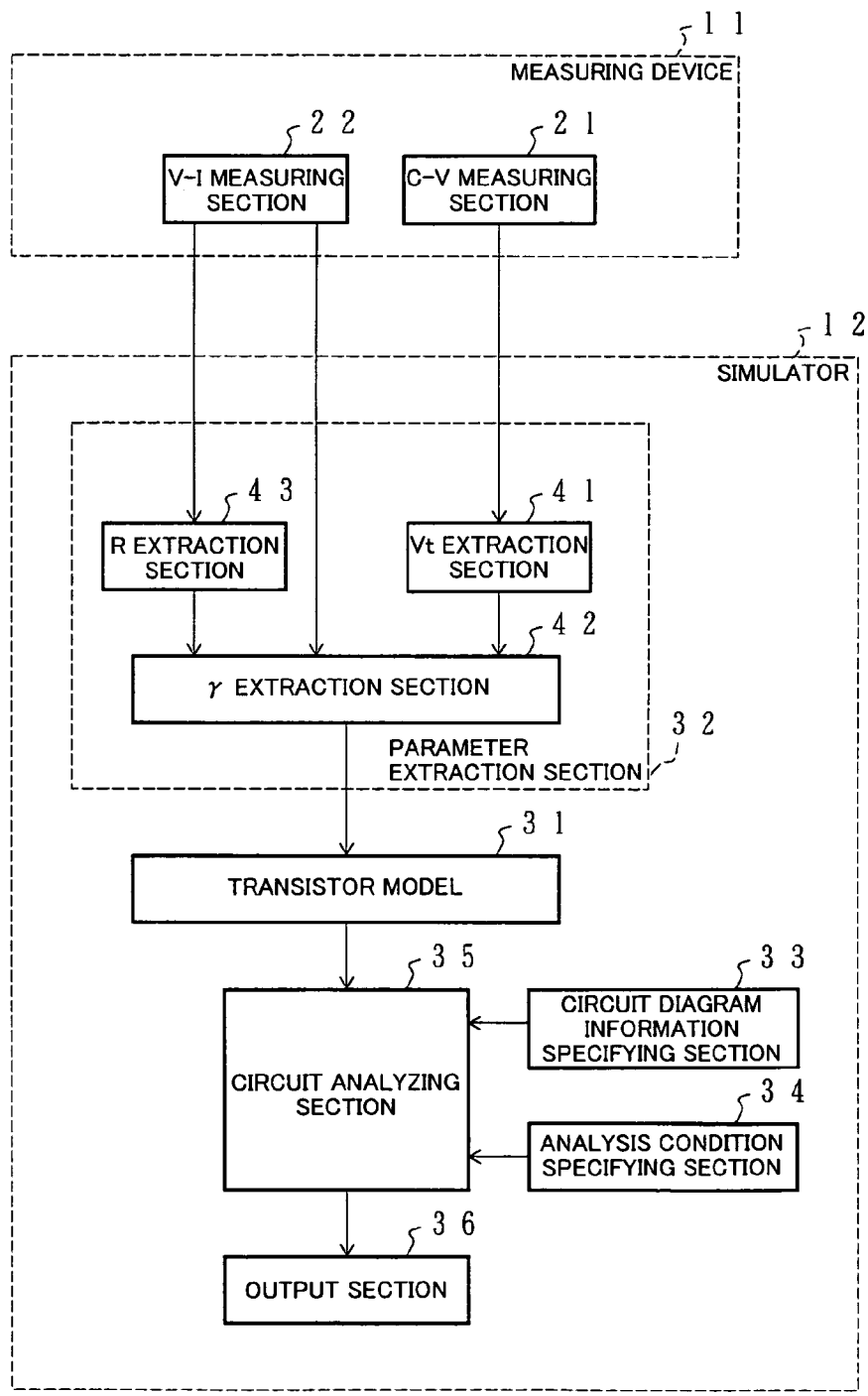
FIG. 1 is a block diagram illustrating the construction of a major part of a simulation system in accordance with an embodiment of the present invention.

Specifically, the simulation system 1 in accordance with the present embodiment, as shown in FIG. 1, includes a measuring device 11 and a simulator 12. The device 11 measures the characteristics of the transistor 2. The simulator 12 extracts parameters for the modeling of the transistor 2 on the basis of measurements by the measuring device 11 and simulates the characteristics of the transistor 2 using the extracted parameter values. The members 21 to 43 in the measuring device 11 and the simulator 12 (detailed later) are function blocks which are provided by a CPU executing program code stored in a storage device to control the operation of peripheral circuits, such as input/output circuits (neither not shown).

The measuring device 11 includes a C-V measuring section 21 which measures the gate voltage vs. transistor capacitance characteristics (C-V characteristics) of the transistor 2 and a V-I measuring section 22 which measures the drain current (Id) vs. drain voltage (Vd) characteristics (V-I characteristics) of the transistor 2 at various gate voltages Vg.

Figure 4:
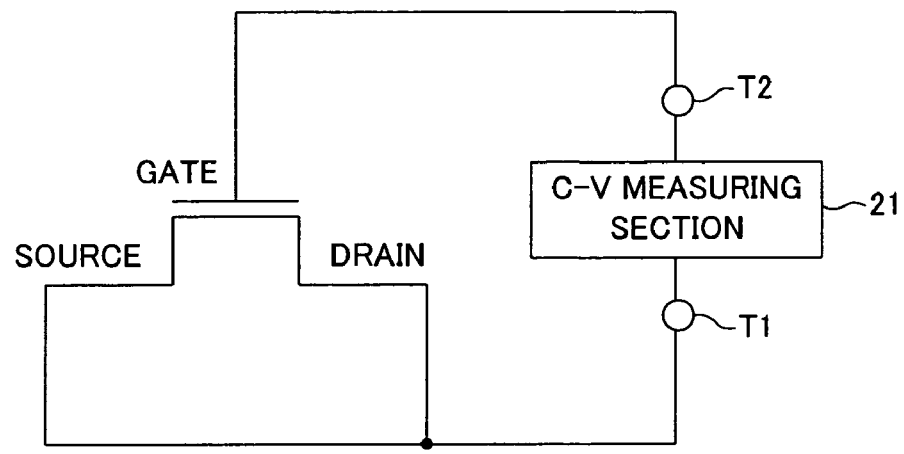
FIG. 4 is a circuit diagram of a C-V measuring section in a measuring device of the simulation system.

The C-V measuring section 21 includes, for example, a terminal T1 which is connected to both the source and the drain of the transistor 2 and a terminal T2 which is connected to the gate thereof, as shown in FIG. 4. The section 21 is capable of measuring capacitance between the terminals T1, T2 under voltage application to the terminals T1, T2, while altering the application voltage (gate voltage).

Figure 5:
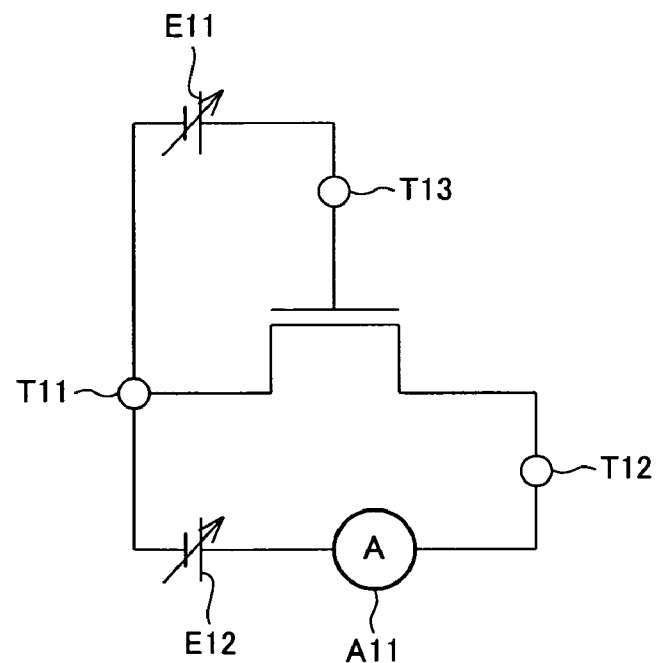
FIG. 5 is a circuit diagram of a V-I measuring section in the measuring device of the simulation system.

The V-I measuring section 22 includes, for example, terminals T11 to T13 which are respective connected to the source, the drain, and the gate of the transistor 2 a variable voltage supply E11 which can alter the voltage applied between the terminals T11, T13 (gate voltage Vg), a variable voltage supply E12 which can alter the voltage applied between the terminals T11, T12 (drain voltage Vd), and an ammeter A11 which measures a current flow through the terminal T12 (drain current Id), as shown in FIG. 5. The section 22 is capable of measuring the drain current vs. drain voltage characteristics of the transistor 2 under a gate voltage Vg, while altering the gate voltage Vg.

The simulator 12 includes a transistor model (transistor characteristics calculation means) 31 simulating the characteristics of the transistor 2 using equation, (5), (6) or (7) above as the model equation and a parameter extraction section (parameter extraction means) 32 extracting parameters for the model equation for output to the transistor model 31 on the basis of the measurements of the transistor 2 by the measuring device 11.

The parameter extraction section 32 includes a Vt extraction section (threshold parameter setting means) 41 and a γ extraction section (γ calculation means, function parameter extraction means) 42. The section 41 extracts threshold parameters $Vt_i$ for the regions $A_i$ from the C-V characteristics measurements by the C-V measuring section 21. The section 42 extracts $\gamma_i$ for the regions $A_i$ from the resistance value R of the source and drain regions not below the gate electrode 105, the threshold parameter $Vt_i$ extracted by the Vt extraction section 41, and the V-I characteristics measurements by the V-I measuring section 22 on a set of transistors 2 which differ from each other in ideal length L of the area functioning as a channel region (in this case, the intrinsic region 113). The area functioning as the channel region is an impurity area, which is a primary factor in resistance variations between the source section electrode and the drain section electrode, where the transistor capacitance varies by the greatest amount of all the regions $A_i$ under an applied voltage exceeding the threshold parameter $Vt_i$. The area, in the FIG. 2 case, is the intrinsic region 113.

The simulation system 1 in accordance with the present embodiment calculates also the resistance value R of the source and drain regions not below the gate electrode 105 from the characteristics measurements on a transistor 3 which has a similar structure to the transistor 2 and is intended for use in resistance measurement in source/drain regions.

Figure 6:
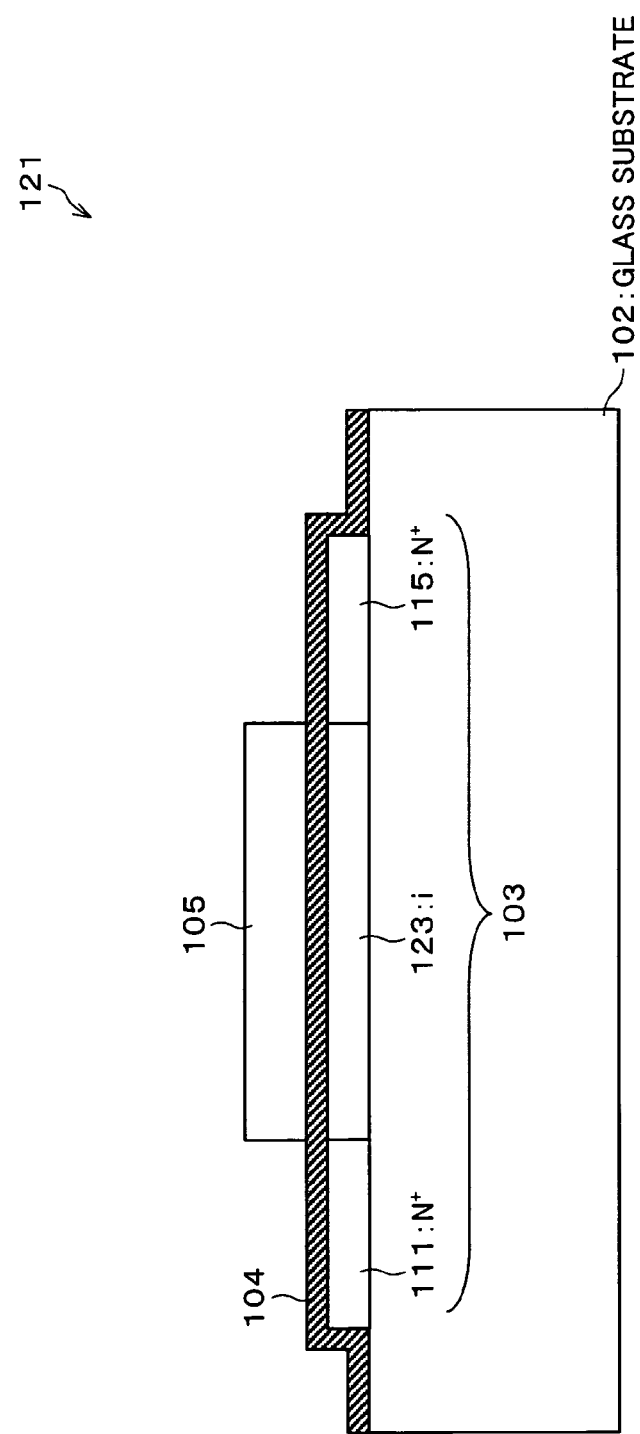
FIG. 6 is a cross-sectional view of the structure of a transistor for resistance measurement in source/drain regions where characteristics are measured by the V-I measuring section.

Specifically, referring to FIG. 6, the transistor 121 as the transistor 3 for use in resistance measurement in source/drain regions ("resistance measurement transistor") exhibits a constant impurity concentration below the gate electrode 105. More specifically, the transistor 121 has the same structure as the simulation target transistor 2 except that the impurity concentration there is equal to that in the area functioning as the channel region. In other words, the resistance measurement transistor 3 has an intrinsic region 123 which is an intrinsic semiconductor region in place of the regions 112 to 114 shown in FIG. 2.

The parameter extraction section 32 includes a R extraction section 43 extracting the resistance value R of parts of the source and drain regions of the simulation target transistor 2 which are not below the gate electrode 105 on the basis of the V-I characteristics of the resistance measurement transistor 3 as measured by the V-I measuring section 22 in the measuring device 11.

Figure 7:
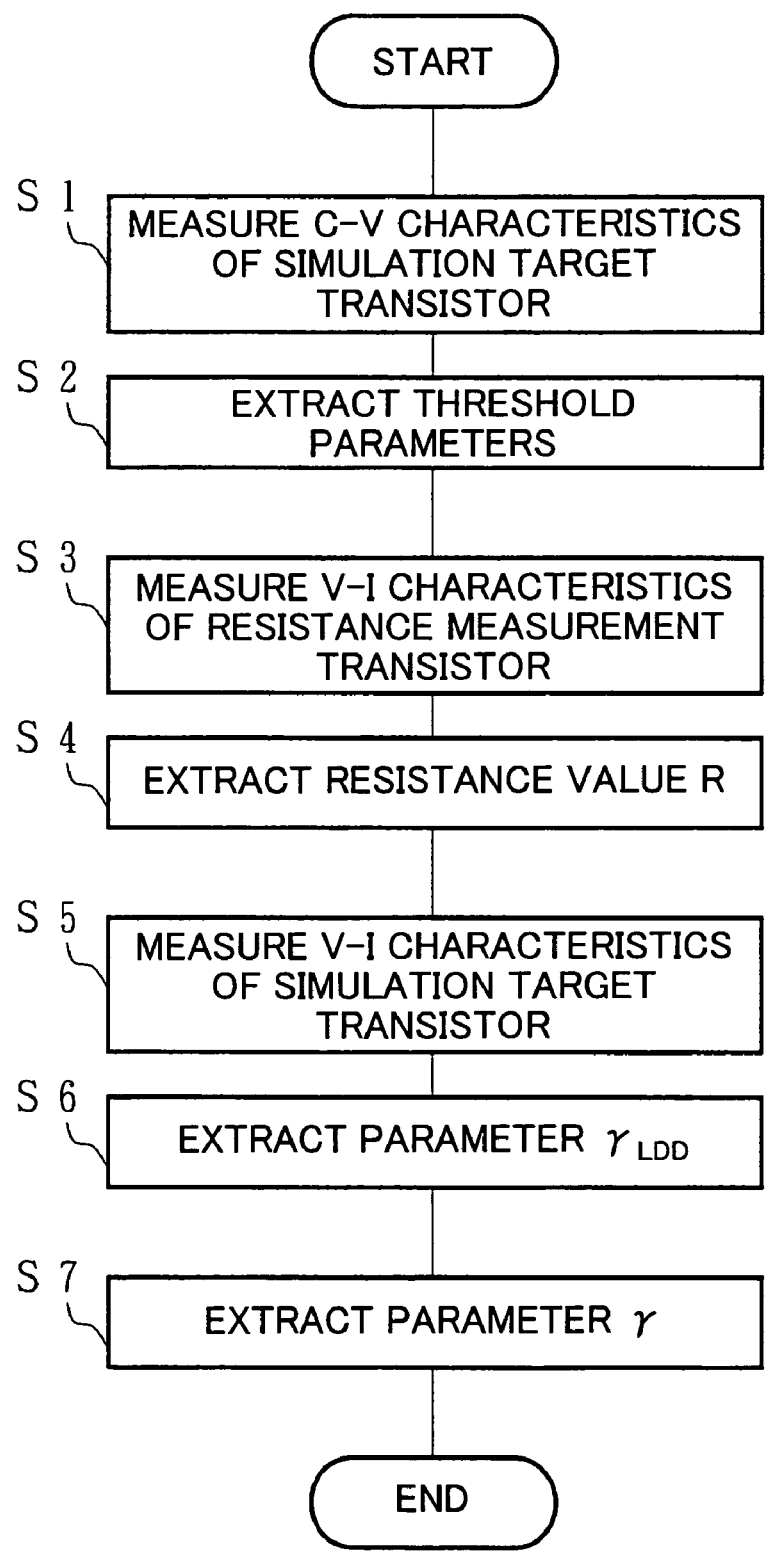
FIG. 7 is a flow diagram illustrating an operation of the simulation system.

Now, referring to the flow diagram in FIG. 7, the following will describe an operation of extracting the parameters R, γ, $\gamma_{LDD}$, Vt, and $Vt_{LDD}$ for equation (8) above which are dictated by the structure of the transistor 2.

In other words, in step 1 ("S1"), the Vt extraction section 41 in the parameter extraction section 32 of the simulator 12 instructs the C-V measuring section 21 of the measuring device 11 to measure the C-V characteristics of the transistor 2 connected to the C-V measuring section 21. Then, in S2, the Vt extraction section 41 extracts the threshold parameters Vt and $Vt_{LDD}$ based on the C-V characteristics.

Specifically, if areas of different impurity concentrations exist below the gate electrode 105, the transistor capacitance changes when a semiconductor element composed of the associated region and regions adjacent to that region changes from an ON state to OFF state, in other words, the voltage exceeds their thresholds.

For example, in the case the thin film transistor 101 in FIG. 2, the three regions, the intrinsic region 113 and the N⁻ regions 112, 114, form those areas of different impurity concentrations, the N⁻ regions 112, 114, located at the ends, have an equal threshold parameter $Vt_i$ as mentioned earlier. Therefore, as shown in FIG. 8, the transistor capacitance of the transistor 2 jumps up at two places where the gate voltage Vg exceeds the threshold parameter Vt for the intrinsic region 113 and where Vg exceeds the common threshold parameter $Vt_{LDD}$ for the N⁻ regions 112, 114.

Figure 9:
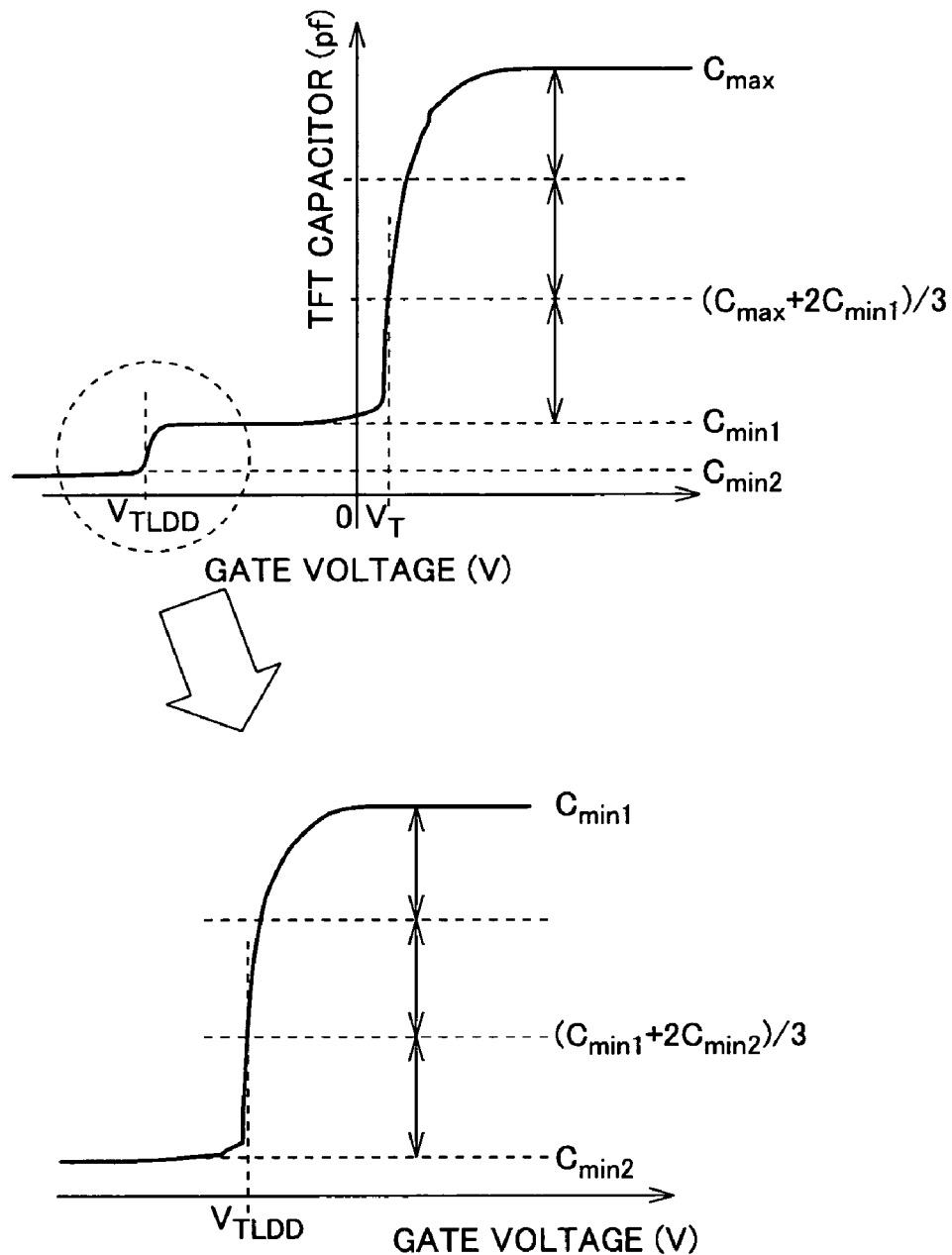
FIG. 9 illustrates a method of extracting a threshold parameter from a transistor's capacitance vs. voltage characteristics.

The Vt extraction section 41 identifies a place/places where the transistor capacitance shows a quick change (2 places in this case) from the C-V characteristics measurements by the C-V measuring section 21 in the measuring device 11 by, for example, finding a section where the transistor capacitance shows a change rate in excess of a predetermined value. The Vt extraction section 41 determines the value of the threshold parameter $Vt_i$ for each of the place(s) as shown in FIG. 9. The threshold parameter $Vt_i$ is equal to the gate voltage ⅓ of the way up as the transistor capacitance increases from "A" to "B" (from Cmin 2 to Cmin 1 and again from Cmin 1 to Cmax in the current case).

Figure 8:
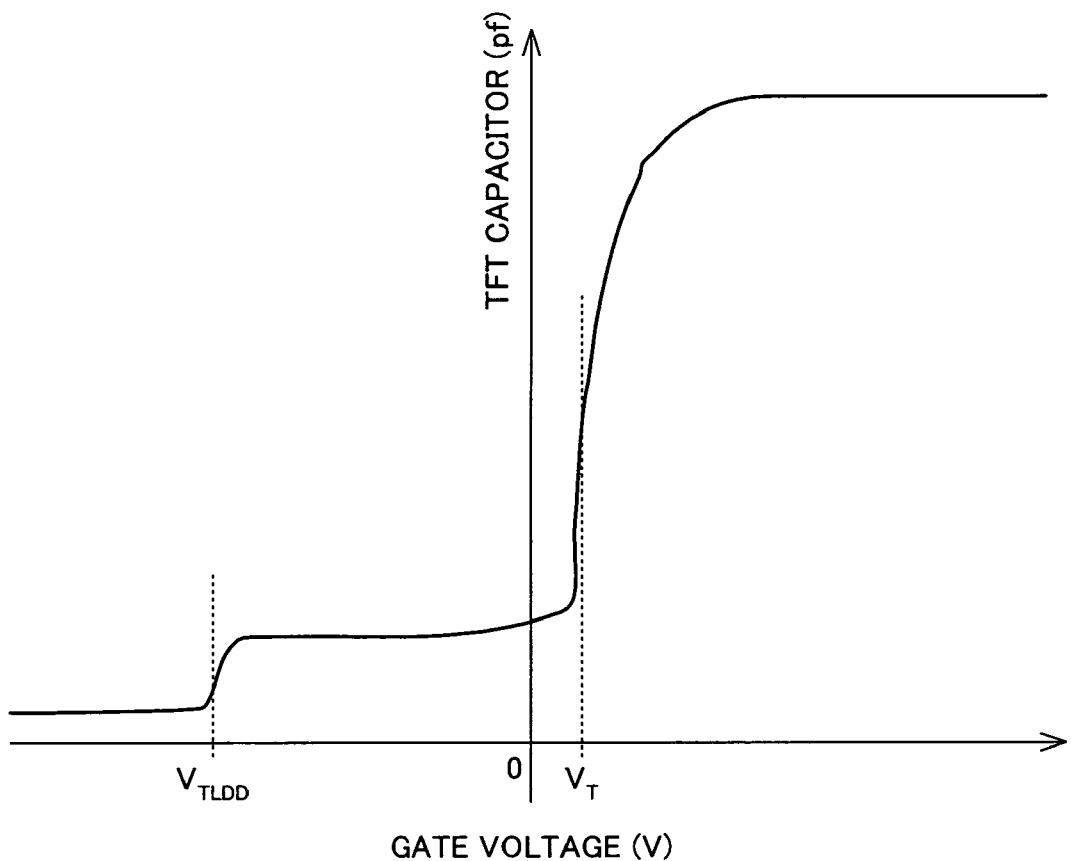
FIG. 8 is a graph representing a transistor's capacitance vs. voltage characteristics as measured by the C-V measuring section.

FIG. 8 shows the results of the determining of the value of the threshold parameter Vt for the intrinsic region 113 and the common threshold parameter $Vt_{LDD}$ for the N⁻ regions 112, 114 based on the C-V characteristics.

The R extraction section 43 in the parameter extraction section 32 of the simulator 12, in S3, instructs the V-I measuring section 22 of the measuring device 11 to measure the V-I characteristics of the resistance measurement transistor 3 connected to the V-I measuring section 22. Under these circumstances, the V-I measuring section 22 sequentially connects resistance measurement transistors 3 which differ from each other in ideal length L of the intrinsic region 123 in the source-drain direction to the respective terminals T11, T12, T13, so as to measure the V-I characteristics of the resistance measurement transistors 3. In S4, the R extraction section 43 extracts the resistance value R of parts of the source and drain regions which are not below the gate electrode 105 from the V-I characteristics.

Specifically, the V-I measuring section 22 measures the drain current vs. drain voltage characteristics while altering the gate voltage Vg applied to the resistance measurement transistor 3.

Figure 10:
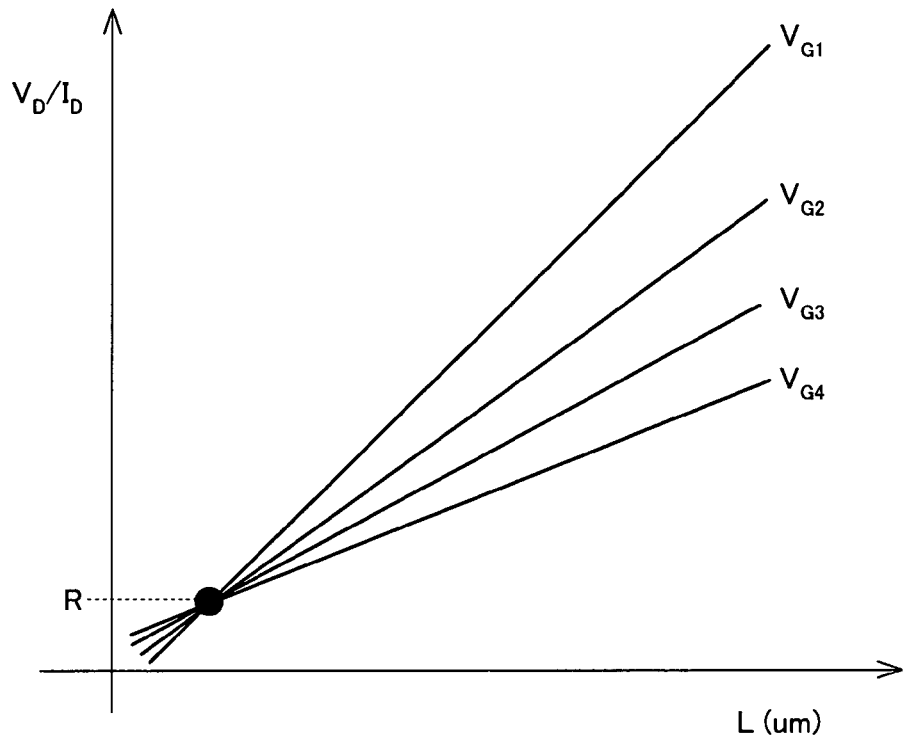
FIG. 10 illustrates a method of extracting a resistance value in source and drain regions which are not below a gate electrode.

Here, the resistance value R of those parts, in the resistance Rds (=Vd/Id) between the source section electrode and the drain section electrode, does not change even if the ideal length L in the source-drain direction changes. As a result, all the lines produced by plotting the dependence of Vd/Id on L for the gate voltages Vg and approximating the dependence with the best fit function intersect at one point, for example, as shown in FIG. 10, provided that there exist no function errors, measurement errors, or errors due to irregularities in the manufacture of the resistance measurement transistors 3.

Therefore, the R extraction section 43 can calculate the resistance Rds between the source section electrode and the drain section electrode from the V-I characteristics of the resistance measurement transistors 3 as measured by the V-I measuring section 22 and approximate the L dependence of Rds for the gate voltages Vg with the function to produce curves which intersect at one point, in order to extract the resistance value R of the parts of the source and drain regions which are not below the gate electrode 105 from the value of the Vd/Id of that point.

For example, the R extraction section 43 may plot the L dependence of the resistance Vd/Id calculated from the I-V characteristics as measured by the V-I measuring section 22 between the source section electrode and the drain section electrode for each gate voltage Vg and approximate the dependence with a linear function based on equation (1) so that the linear function produces minimum measurement errors. Thus, Vd/Id changes linearly with L, and the resultant lines for the gate voltages Vg all intersect virtually at one common point. The R extraction section 43 stores the average of the y-coordinates (resistance values) of all the intersecting points of the lines for the gate voltages Vg (intersecting points of all pairs of the lines) as the resistance value R.

As another example, the R extraction section 43 approximates the resistances Rds calculated from the drain current vs. drain voltage characteristics measurements for each gate voltage Vg with a linear function of the ideal length L which passes through a point common to all the gate voltages Vg, by adjusting the common point and the tilt of the linear function so as to minimize measurement errors. When the common point at which the measurement errors are minimum is calculated, the R extraction section 43 may store the y-coordinate (resistance value) of that common point as the resistance value R.

Following the measuring of the threshold parameters $Vt_i$ and $Vt_{LDD}$ and the resistance value R in S1 through S4, the $\gamma$ extraction section 42 extracts a $\gamma_{LDD}$ common to the transistors 2 shown in FIG. 1 (S6) on the basis of the V-I characteristics of the simulation target transistors 2 given in S5 by the V-I measuring section 22, as well as the threshold parameters $Vt_{LDD}$ and the resistance value R.

Specifically, in S5, the $\gamma$ extraction section 42 in the parameter extraction section 32 of the simulator 12 instructs the V-I measuring section 22 of the measuring device 11 to measure the V-I characteristics of the transistor 2 connected to the V-I measuring section 22. The V-I measuring section 22 measures the V-I characteristics of transistors 2 differing from each other in the ideal length L of the intrinsic region 113 in the source-drain direction and otherwise identical, by sequentially connecting them to the terminals T11, T12, T13.

Rearranging equation (8), equation (9) is obtained:

$$(Vd/Id-R)\cdot(Vg-Vt_{LDD})=[(Vg-Vt_{LDD})/(Vg-Vt)]\cdot\gamma+\gamma_{LDD} \quad (9)$$

Figure 11:
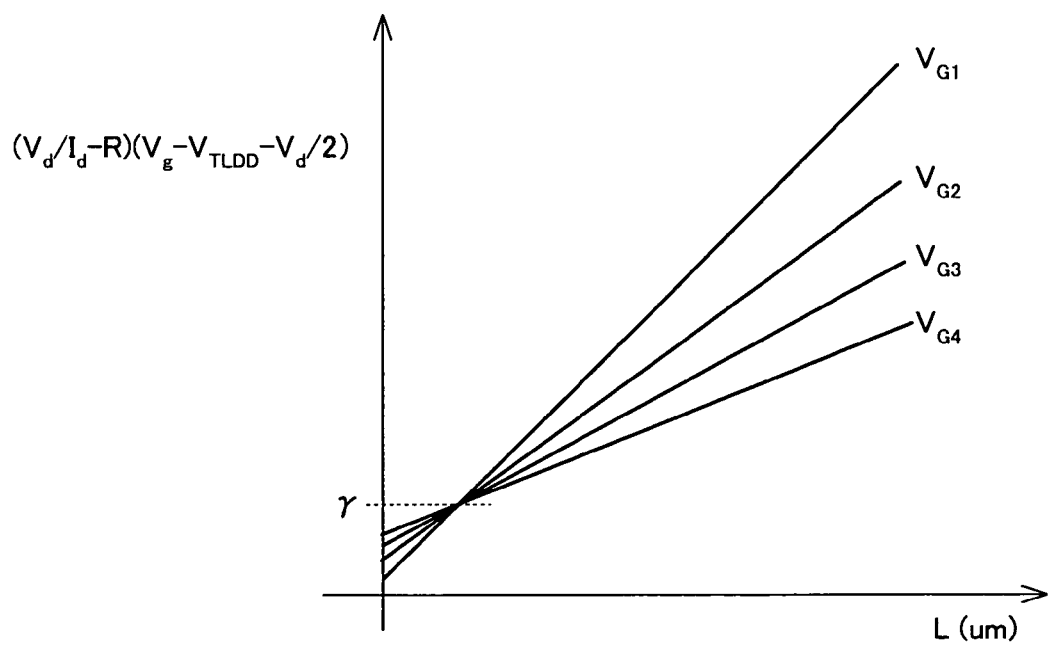
FIG. 11 illustrates a method of extracting a parameter γ of a model equation on simulation by the simulation system.

$\gamma_{LDD}$ does not change even if the ideal length L of the intrinsic region 113 in the source-drain direction changes, because the N⁻ regions 112, 114 in all the transistors 2 are identical. Only the $\gamma$, i.e. $L_i/(Weff\cdot\mu_i\cdot Cox)$ of the intrinsic region ($A_2$) 113 changes if the ideal length L changes. Thus, the lines produced plotting the dependence on the ideal length L in the source-drain direction on the left side of equation (9) for the gate voltages Vg and approximating the dependence with the best fit function intersect at one point, for example, as shown in FIG. 11, provided that there exist no function errors, measurement errors, or errors due to irregularities in the manufacture of the transistors 2.

Therefore, the $\gamma$ extraction section 42 can in S6 evaluate the left side of equation (9) from the V-I characteristics of the simulation target transistors 2 as measured by the V-I measuring section 22 and approximate the dependence of the left side value on the ideal length L with a the function to produce curves which intersect at one point, in order to extract the parameter $\gamma_{LDD}$ from the left side value at which the curve intersect.

For example, the $\gamma$ extraction section 42 plot the L dependence of the left side value of equation (9) calculated from the I-V characteristics as measured by the V-I measuring section 22 for the gate voltages Vg and approximate the dependence with a linear function based on equation (9) so that the linear function produces minimum measurement errors. Thus, the left side value changes linearly with L, and the resultant lines for the gate voltages Vg all intersect virtually at one common point. The $\gamma$ extraction section 42 stores the average of the y-coordinates ($\Omega\cdot V$) of all the intersecting points of the lines for the gate voltages Vg (intersecting points of all pairs of the lines) as the parameter $\gamma_{j-1}$.

As another example, the $\gamma$ extraction section 42 approximates the left side values of equation (9) calculated from the V-I characteristics measurements for each gate voltage Vg with a linear function of the ideal length L which passes through a point common to all the gate voltages Vg, by adjusting the common point and the tilt of the linear function so as to minimize measurement errors. When the common point at which the measurement errors are minimum is calculated, the $\gamma$ extraction section 42 may store the y-coordinate ($\Omega\cdot V$) of that common point as the parameter $\gamma_{LDD}$.

Following the determining of the parameters $Vt_i$, R, $\gamma_{LDD}$ in S1 through S6, the $\gamma$ extraction section 42 in S7 calculates, for example, the parameters Loff and $\mu$ in the $\gamma=(L-Loff)/(Weff\cdot\mu\cdot Cox)$ at which equation (8) best fits the V-I characteristics of the transistors 2 with different L, based on these parameters, as well as the V-I characteristics measurements in S5.

In this manner, the simulation system 1 in accordance with the present embodiment extracts the threshold parameters $Vt_i$ for the regions $A_i$ from, for example, the C-V characteristics of simulation target transistors 2 and extracts $\gamma_i$ for the regions $A_i$ from the resistance value R of the source and drain regions which are not below the gate electrode 105, the threshold parameter $Vt_i$ extracted by the Vt extraction section 41, and the V-I characteristics of transistors 2 differing from each other in the ideal length L of the area functioning as the channel region (intrinsic region 113 in this case). Therefore, the system 1 is capable of extracting the parameters to high accuracy which well fit actual simulation target transistors 2.

Especially, the present embodiment extracts the threshold parameters for the regions from the C-V characteristics of the simulation target transistor 2. Therefore, a single measurement of the C-V characteristics can extract all the threshold parameters, regardless of the number of threshold parameters.

Further, the simulation system 1 in accordance with the present embodiment, as in S3 and S4, calculates the resistance value R of parts of the source and drain regions which are not below the gate electrode 105 from the measurements of characteristics of the resistance measurement transistor 3. Therefore, the resistance value R can be highly accurately calculated when compared with another measurement or calculation method for the resistance value, for example, in a case where the resistance value of a region formed on the same substrate as the simulation target transistor 2 at the same impurity concentration is measured with the measurements used as the resistance value R. Thus, the simulation system 1 in accordance with the present embodiment is capable of more accurately extracting the parameter $\gamma_i$ for equation (6) or the parameters $\gamma$ and $\gamma_{LDD}$ for equation (8) and highly accurately simulating the characteristics of the transistor 2.

Further, the simulation system 1 in accordance with the present embodiment is arranged to simulate not only the characteristics of the simulation target transistor 2, but also those of a circuit including the transistor 2.

Specifically, as shown in FIG. 1, the simulator 12 in accordance with the present embodiment includes a circuit diagram information specifying section 33 specifying circuit diagram information of a circuit, an analysis condition specifying section 34 specifying analysis conditions in analyzing the circuit, a circuit analyzing section (electrical characteristics calculation means) 35 analyzing the circuit in reference to the transistor model 31 according to the circuit diagram information and the analysis conditions specified by the specifying sections 33, 34, and an output section 36 outputting results of the analysis.

The circuit diagram information represents interconnection between devices in the simulation target circuit. The information is, for example, provided in so-called net list format.

The analysis conditions include device parameters, simulation periods, and time steps in simulation. When the simulation target circuit has input terminals for signals and voltage, the analysis conditions further includes information on the signal waveform and voltage applied to the terminals.

Figure 12:
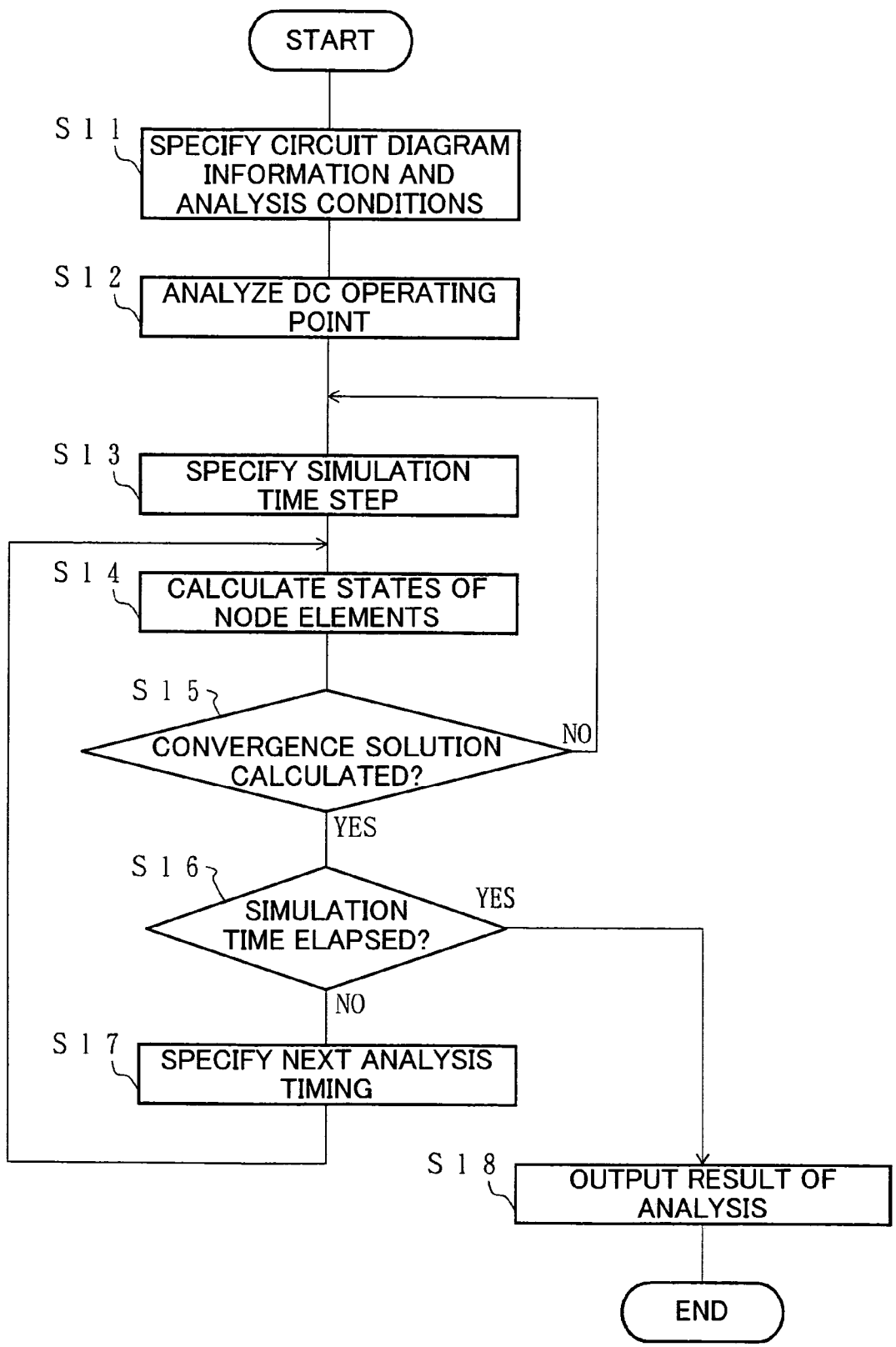
FIG. 12 is a flow diagram illustrating an operation of the simulation system when it simulates electrical characteristics of a circuit.

In the arrangement, in S11 in FIG. 12, the circuit diagram information specifying section 33 and the analysis condition specifying section 34 specify for themselves the circuit diagram information and the analysis conditions in accordance with, for example, user instructions.

Figures 13, 14:
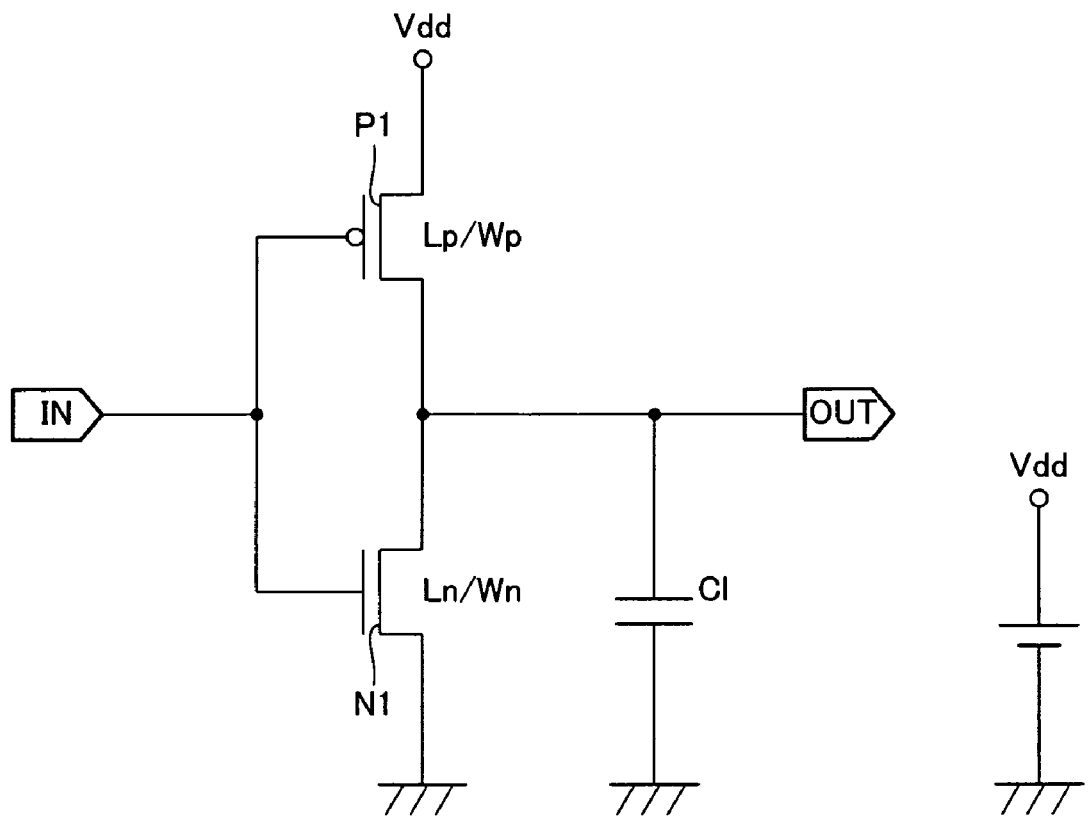
FIG. 13 shows a circuit which is a simulation target.
FIG. 14 describes analysis conditions for simulation of the circuit.
Figure 15:
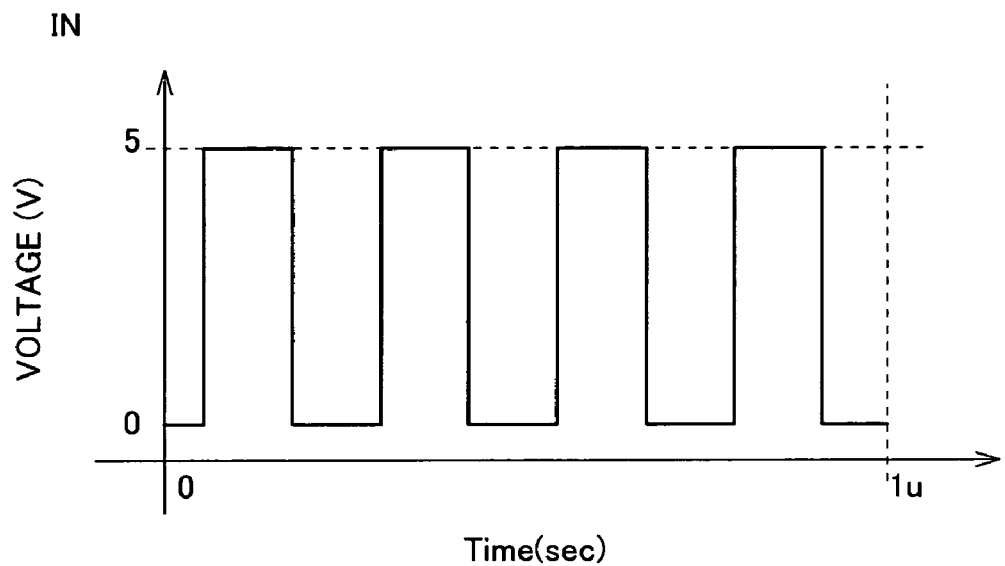
FIG. 15 is a waveform diagram showing an input signal for simulation of the circuit.

For example, in simulating the circuit shown in FIG. 13, the circuit diagram information specifying section 33 specifies information on the circuit devices, i.e. the transistors P1, N1, capacitor C1, and power supply Vdd, and their interconnection as the circuit diagram information. In the same situation, the analysis condition specifying section 34, as shown in FIG. 14, specifies the parameters of the circuit devices and the simulation period, as well as the input signal waveform shown in FIG. 15. In the present embodiment, among the analysis conditions, a simulation time step is specified in S13 (detailed later), not in S11.

With the circuit diagram information and analysis conditions being specified in S11, the circuit analyzing section 35 in S12 analyzes a DC operating point on the basis of the circuit diagram information and the analysis conditions. Further, when the analysis condition specifying section 34 is fed with the simulation time step in S13, the circuit analyzing section 35 simulates the circuit based on that time step in S14 to S16.

Specifically, the circuit analyzing section 35 in S14 calculates the states of the node elements of the circuit represented by the circuit diagram information once every time step, starting at a simulate starting time. Here if the simulation target transistor 2 is one of circuit devices as is the case with N1 and P1 in FIG. 13, the circuit analyzing section 35 asks the transistor model 31 for the characteristics of the transistor 2, by providing necessary parameters in the transistor model 31 so doing, for example, Lp/Wp and Ln/Wn, to the transistor model 31.

If the S14 calculation gives a convergence solution (YES in S15), the circuit analyzing section 35 determines whether the current simulation time is a simulation ending time. If the simulation is not ended yet, (NO in S16), the current simulation time is advanced by a time step in S17, whereupon the operation returns to S14 to perform its succeeding steps to calculate the states of the node elements at that time.

S14 to S17 are then repeated until the current simulation time exceeds the simulation ending time (YES in S16). In S18, the output section 36 outputs results of the analysis by the circuit analyzing section 35.

Figure 16:
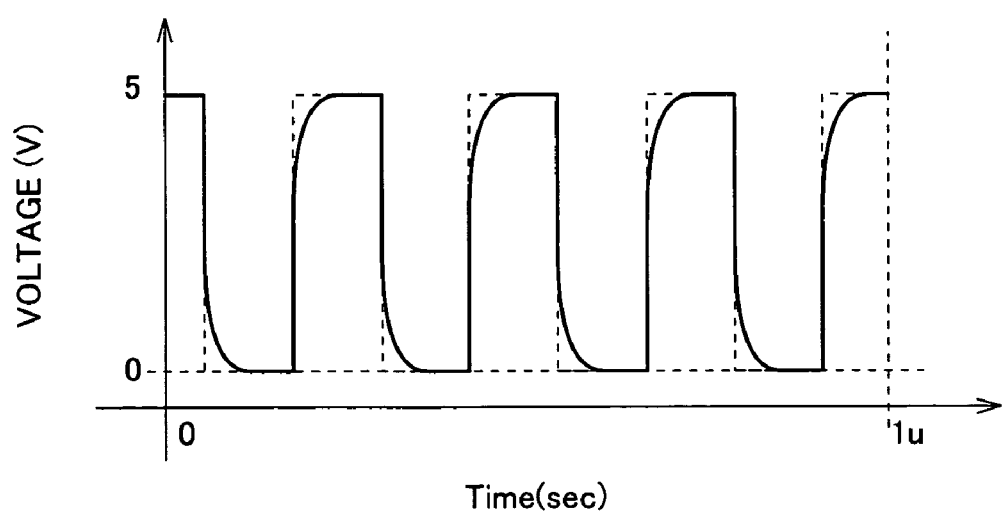
FIG. 16 is a waveform diagram showing an output signal as simulated by the simulation system.

For example, when the output section 36 has received an instruction to output a signal waveform at the output terminal Tout, the output section 36 in S14 obtains from the circuit analyzing section 35 results of the analysis by the circuit analyzing section 35, more specifically, a voltage across a node element corresponding to the output terminal Tout at simulation times, so as to plot the voltage against time. Thus, the output section 36 can display the output waveform of the FIG. 12 circuit as shown in FIG. 16.

If the S14 calculation gives no convergence solution, the circuit analyzing section 35 instructs the analysis condition specifying section 34 to input the simulation time step again.

Incidentally, the foregoing description discussed as an example, the simulation target transistor 2 including areas of different impurity concentrations below the gate electrode 105 is the thin film transistor 101 shown in FIG. 2. This is by no means meant to be limiting. The simulation target transistor 2 may be an FET 101a fabricated in a semiconductor thin film (103) in a SOI (Silicon On Insulator) structure as shown in FIG. 17 or an FET 101b provided on a semiconductor substrate as shown in FIG. 19.

Figure 17:
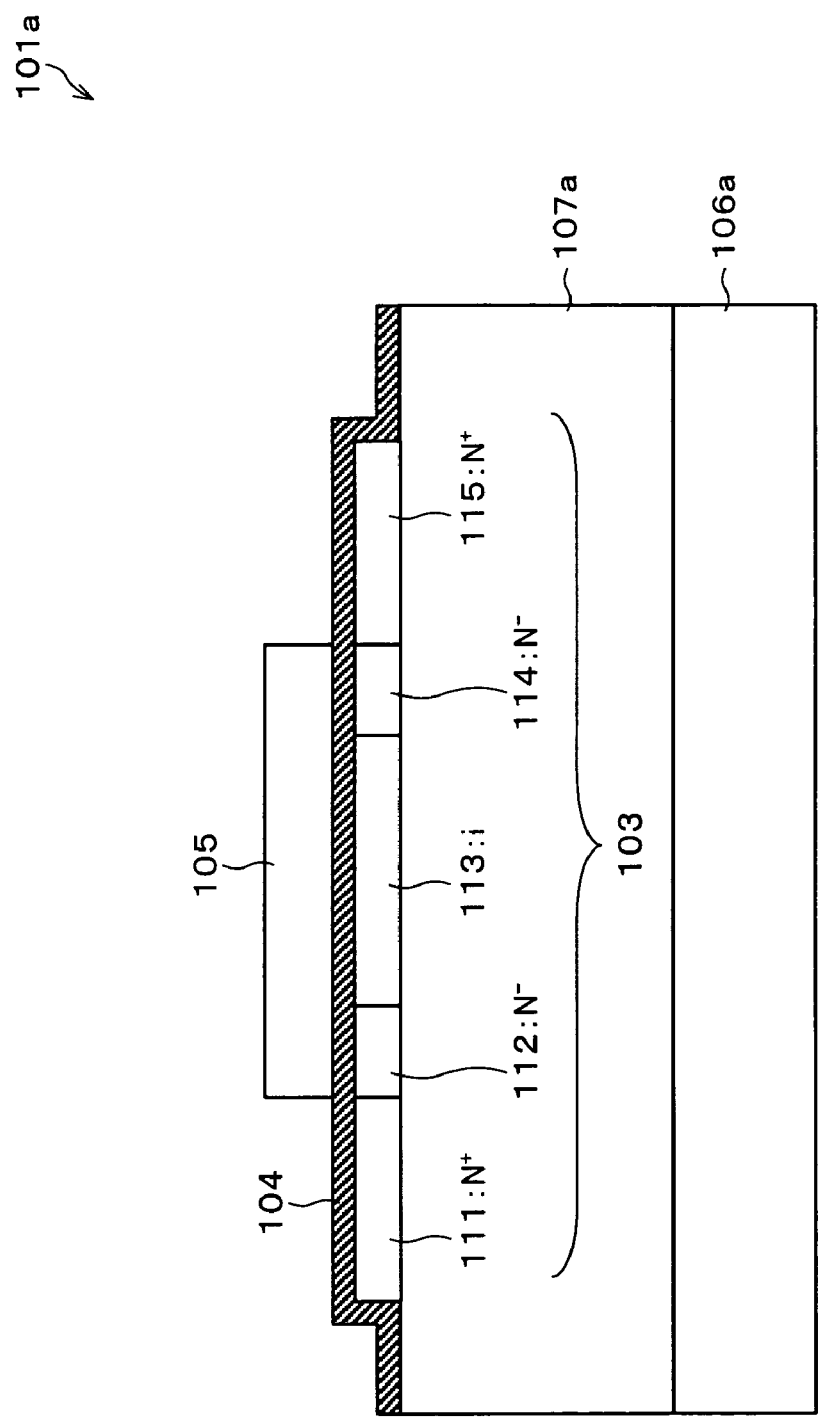
FIG. 17 is a cross-sectional view of the structure of a transistor which is another simulation target.

To describe in greater detail, as shown in FIG. 17, the FET 101a has a substantially similar structure to the thin film transistor 101 in FIG. 2. The semiconductor thin film 103 acting as an active layer is not provided on a glass substrate 102, but on a semiconductor substrate 106a with an intervening insulating film 107a. Examples of SOI structure are, for example, SOS (Silicon On Sapphire), SIMOX (Silicon Separation by ion IMplantion of OXigen), and BSOI (Bonded SOI), where the semiconductor thin film 103 is deposited on a substrate 106a made of an electric insulator, such as silicon, sapphire, quartz, or glass, with an intervening an insulating film 107a made of $SiO_2$ or another electric insulator. FIG. 17 shows a silicon substrate 106a as an example.

Figure 18:
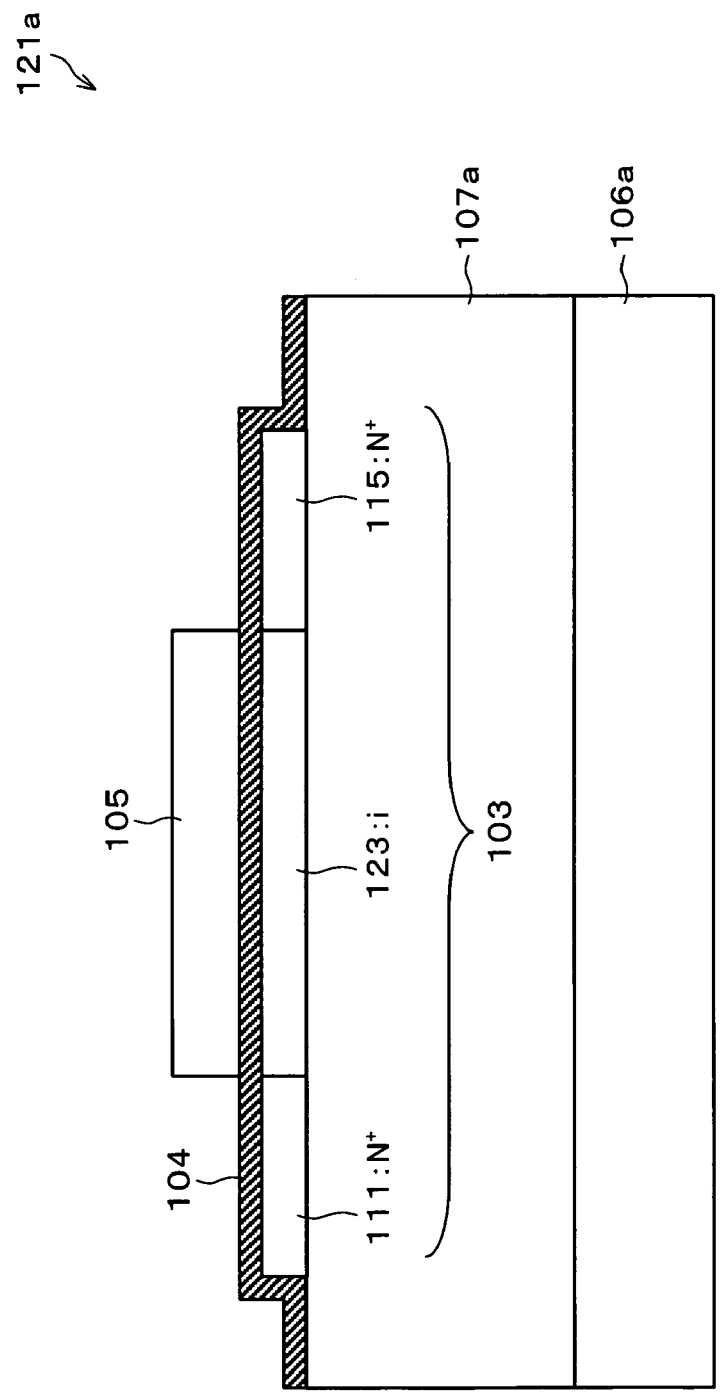
FIG. 18 is a cross-sectional view of the structure of another transistor for resistance measurement in source/drain regions.

In the case of a silicon substrate 106a, an FET 121a is used as the resistance measurement transistor 3 as shown in FIG. 18 where the regions 112, 113, 114 in the FET 101a are replaced with an intrinsic region 123.

Figure 19:
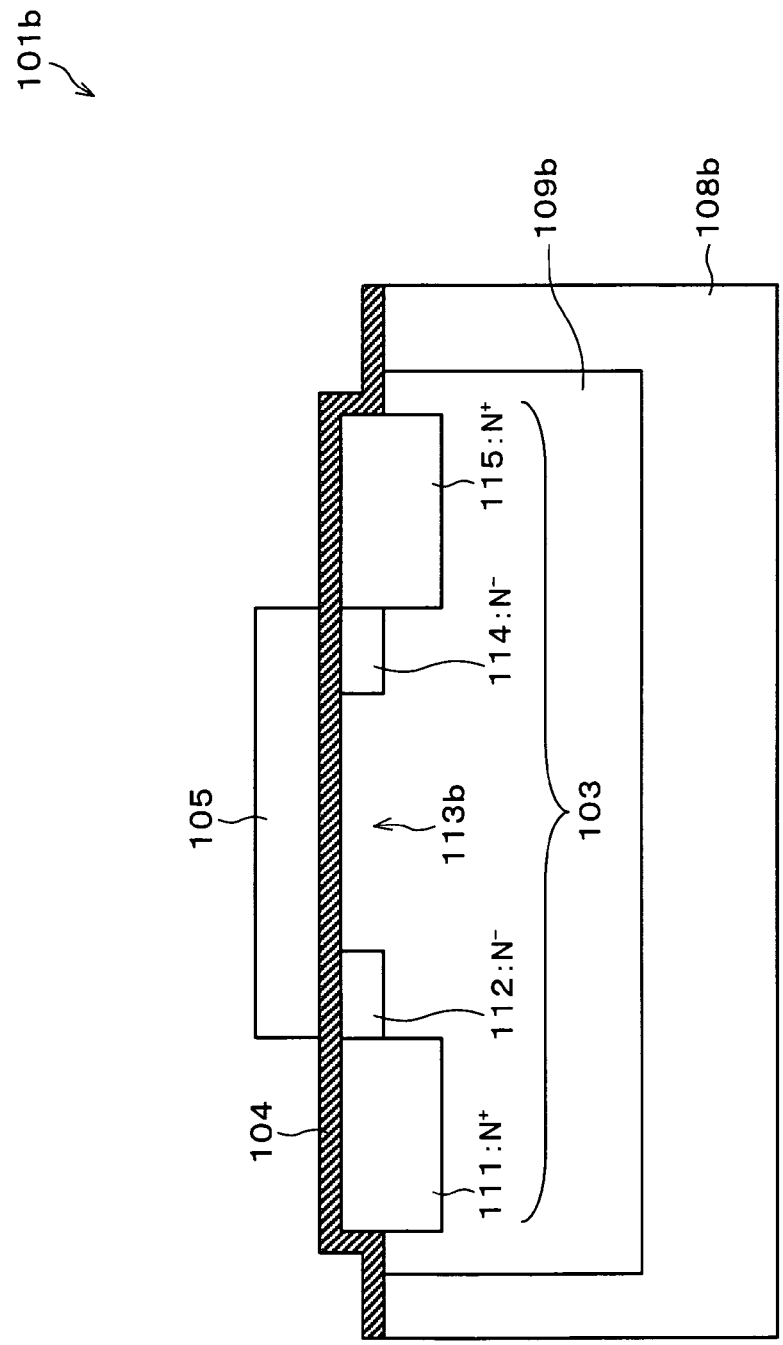
FIG. 19 is a cross-sectional view of the structure of a transistor which is a further simulation target.

In contrast, the FET 101b shown in FIG. 19 has a substantially similar structure to the thin film transistor 101 shown in FIG. 2; however, the regions 111 to 115 are formed not in the semiconductor thin film 103, but in a well region 109b of a second conduction type on a semiconductor substrate 108b. As mentioned earlier, in the examples, the first conduction type is negative; the second conduction type is positive, the opposite conduction type to the first.

In the FET 101b, the regions 111 to 115 are formed in the well region 109b; therefore, the intrinsic region 113 is replaced by a p region 113b which is a part of the p well region 109b. The p region 113b acts as the channel region.

Figure 20:
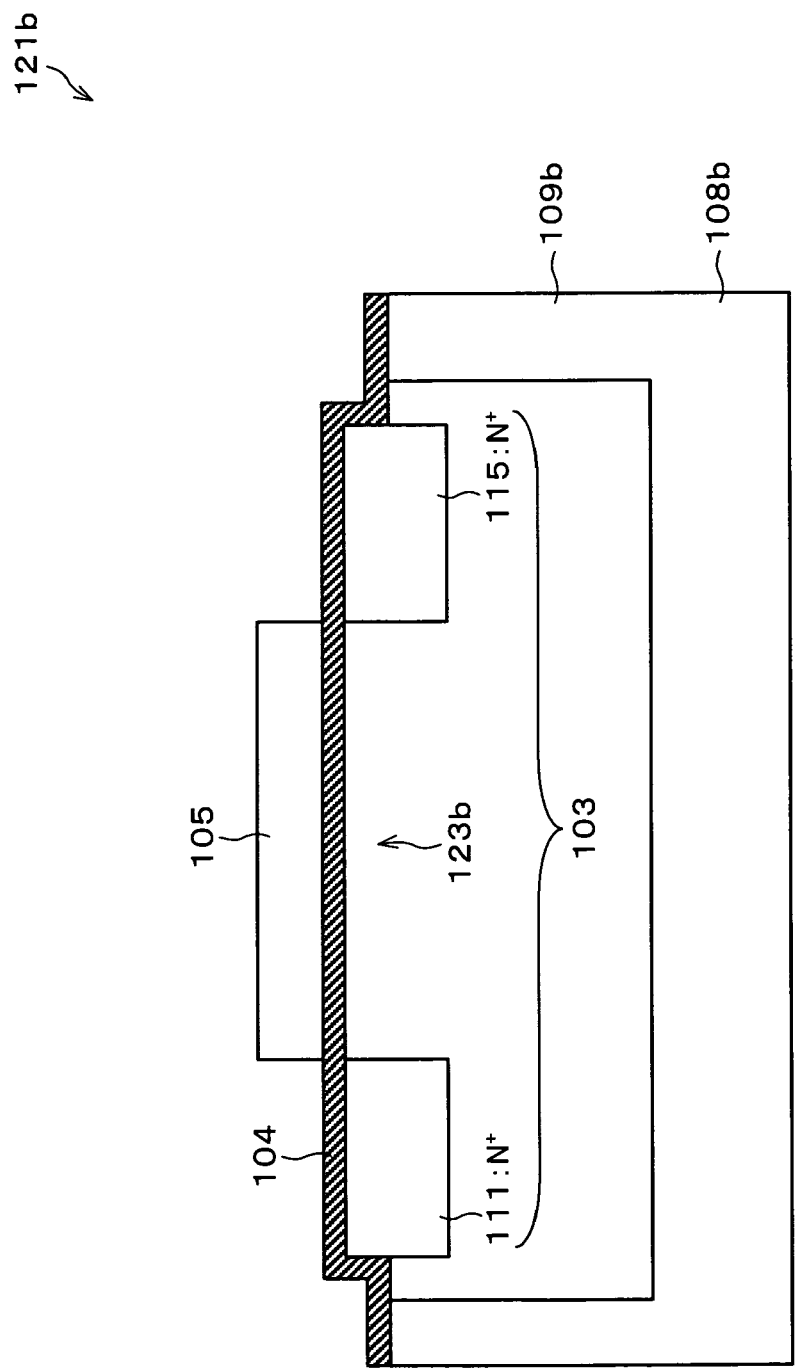
FIG. 20 is a cross-sectional view of the structure of a further transistor for resistance measurement in source/drain regions.

In this case, an FET 121b is used as the resistance measurement transistor 3 as shown in FIG. 20 where the regions 112, 113b, 114 in the FET 101b are replaced with a p region 123b.

Whatever structure the simulation target transistor 2 has, the simulation system 1 in accordance with the present embodiment can highly accurately simulate a transistor of a given structure so long as the transistor includes regions of different impurity concentrations below a gate section.

Embodiment 2

Figure 21:
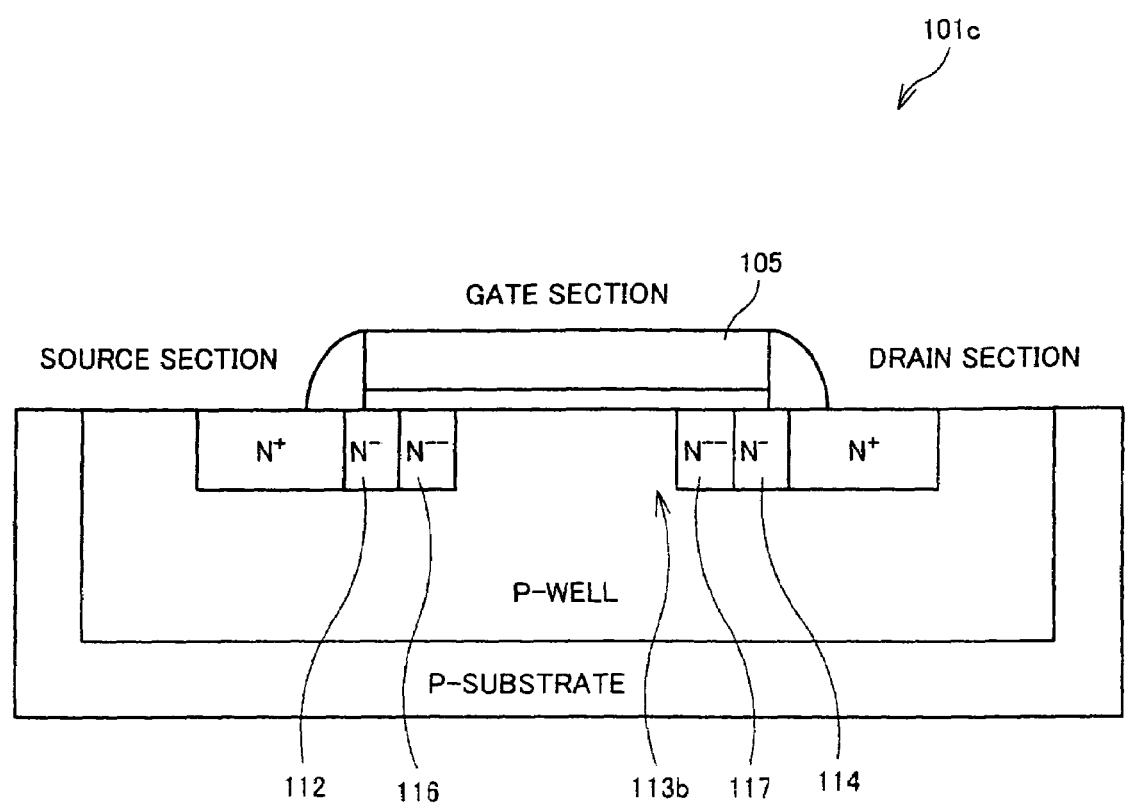
FIG. 21, illustrating another embodiment of the present invention, is a cross-sectional view of the structure of a transistor which is yet another simulation target.
Figure 23:
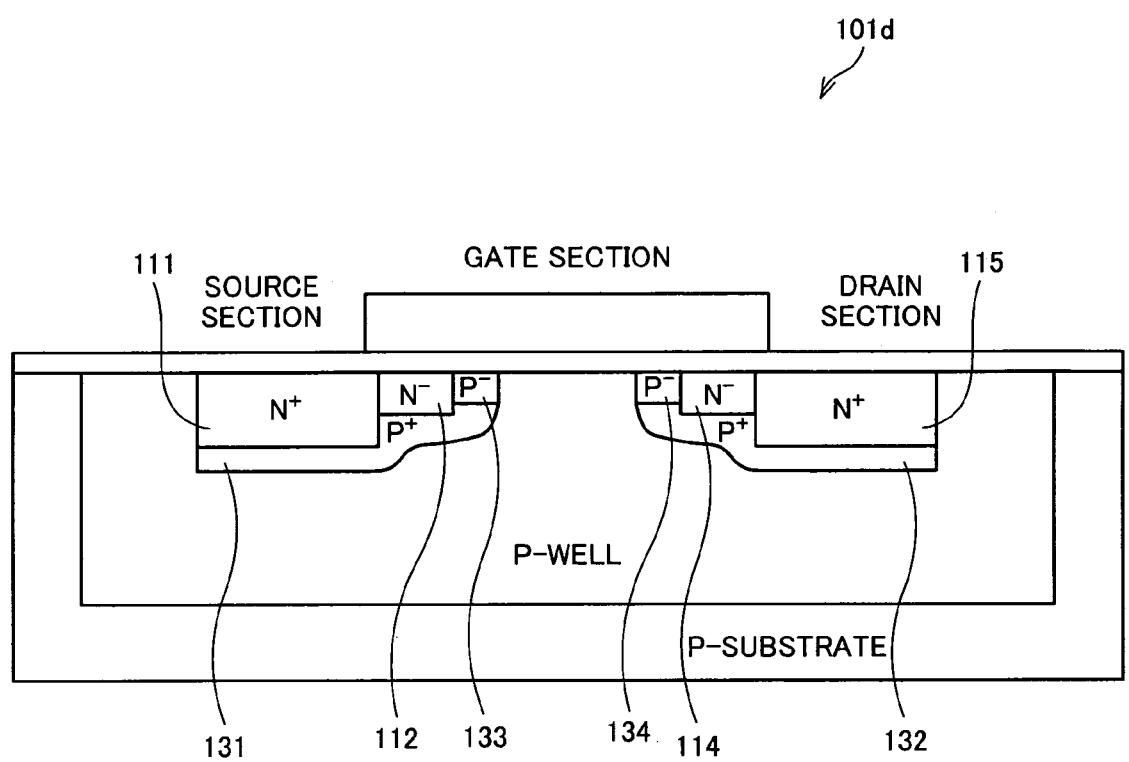
FIG. 23 is a cross-sectional view of the structure of a transistor which is another simulation target.
Figure 24:
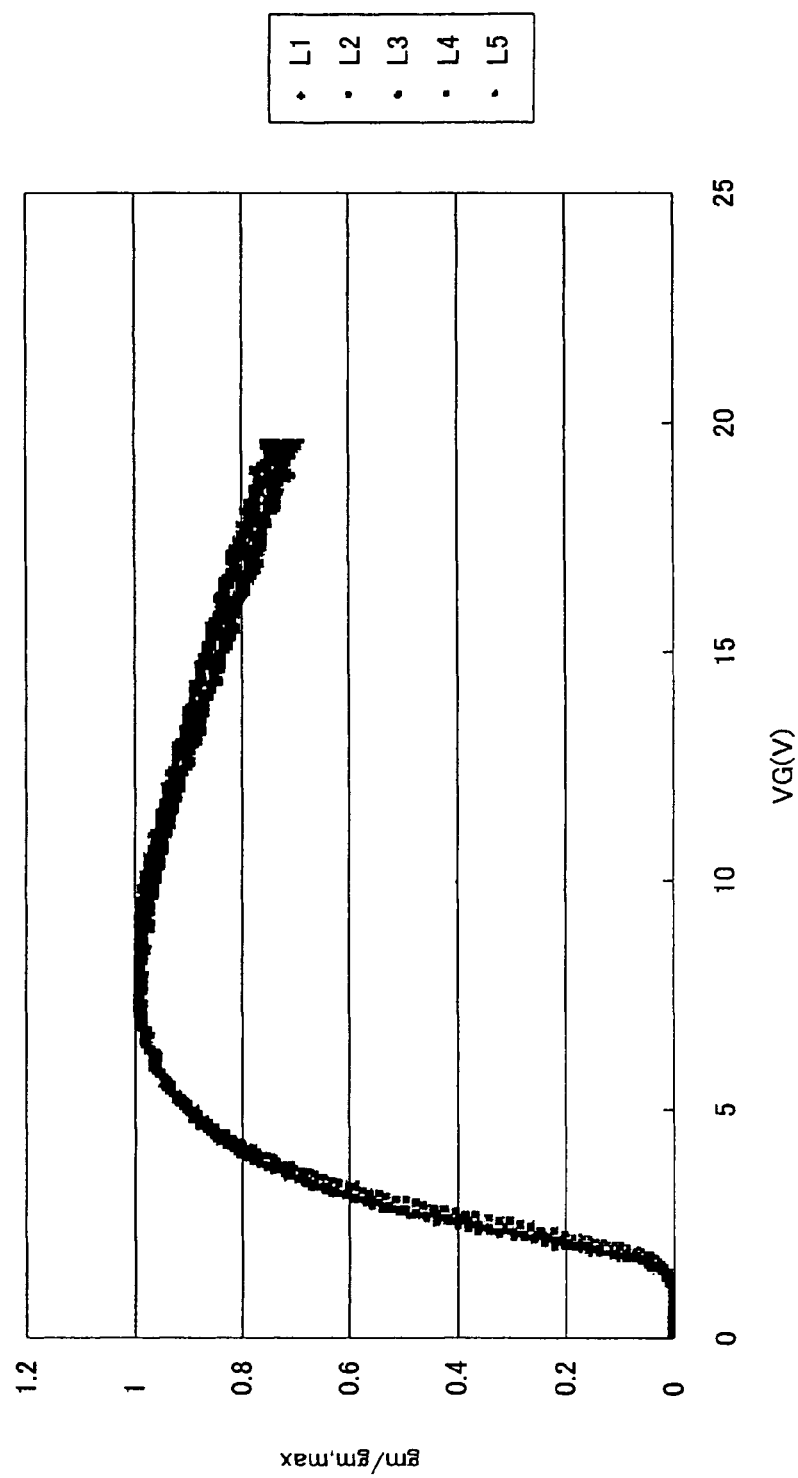
FIG. 24, depicting conventional art, is a graph representing results of extraction of intrinsic gm of a transistor having a constant impurity concentration below the gate section using a conventional model equation.

So far, the description discussed examples involving three regions of different impurity concentrations below a gate section as shown, for example, in FIG. 2. The number of such regions is not limited to this. For example, four or more regions may be provided as shown in FIG. 21 and FIG. 23.

The present embodiment will deal with more general cases, assuming that n regions of different impurity concentrations (n is an integer more than or equal to 2) are provided below a gate section. In other words, it is assumed that adjacent areas $A_1$ to $A_n$ of different impurity concentrations were provided below a gate section.

On that assumption, the simulation system 1 in accordance with the present embodiment uses equations (10), (11) below instead of equations (5), (6) above in modeling:

$$Rds = Vd/Id = \sum [L_i / \{(W_i \cdot \mu_i \cdot Cox_i) \cdot (Vg - Vt_i)\}] + R \quad (10)$$

$$= \sum [\gamma_i / (Vg - Vt_i)] + R \quad (11)$$

where Σ is a summation symbol with the index i from 1 to n.

For example, an FET 101c shown in FIG. 21 has a substantially similar structure to the FET 101b shown in FIG. 19, except that the former includes N⁻⁻ regions 116, 117 of the first conduction type which are lower in impurity concentration respectively than the N⁻ regions 112, 114, between the N⁻ region 112 and the p region 113b and also between the p region 113b and the N⁻ region 114.

With the FET 101c used as the simulation target transistor 2, there are five regions provided below the gate electrode 105: the N⁻ region 112 ($A_1$), the N⁻⁻ region 116 ($A_2$), the p region 113b ($A_3$), the N⁻⁻ region 117 ($A_4$), and the N⁻ region 114 ($A_5$). The "n" in equations (10), (11) is equal to 5.

Also in equations (10), (11), when the transistor 2 has a symmetric structure with respect to the central line of an area functioning as the channel region (intrinsic region 113 in the current case), in other words, an area defined as the channel region in an impurity concentration region which may be the primary factor of variations of the resistance between the source section electrode and the drain section electrode, a threshold parameter $Vt_i$ corresponding to an area on one side of the line is equal to a threshold parameter $Vt_i$ corresponding to the symmetric area on the side of the line. Therefore, terms corresponding to these two areas can be reduced to a single term as with equations (7), (8).

For example, for the FET 101c in FIG. 21, the threshold parameters $Vt_1$, $Vt_5$ are equal, and the threshold parameters $Vt_2$, $Vt_4$ are equal. Therefore, suffixing N⁻ to the parameter of the reduced term for the regions $A_1$, $A_5$, N⁻⁻ to the parameter of the reduced term for the regions $A_2$, $A_4$, and p to the parameter for the region $A_3$, equations (10), (11) become:

$$\begin{aligned}Rds &= Vd/Id \\ &= LN^- / \{(Weff \cdot \mu_{N-} \cdot Cox) \cdot (Vg - Vt_{N-})\} + \\ &\quad LN^{--} / \{(Weff \cdot \mu_{N--} \cdot Cox) \cdot (Vg - Vt_{N--})\} + \\ &\quad L_p / \{(Weff \cdot \mu_p \cdot Cox) \cdot (Vg - Vt_p)\} + R \end{aligned} \quad (12)$$

$$\begin{aligned} &= \gamma_{N-} / (Vg - Vt_{N-}) + \\ &\quad \gamma_{N--} / (Vg - Vt_{N--}) + \gamma_p / (Vg - Vt_p) + R \end{aligned} \quad (13)$$

In this manner, in the simulation system 1 in accordance with the present embodiment, when n is greater than 3, the transistor model 31 of the simulation system 1 simulates the characteristics of the simulation target transistor 2 by equations (10) through (13) as model equations. Therefore, similarly to the first embodiment, although the transistor 2 including regions of different impurity concentrations below a gate section is a simulation target, the characteristics of the transistor 2, including subthreshold regions where evaluation through actual measurement is difficult, can be simulated to high accuracy while maintaining a good fit to the capacitance model. In addition, the simulation of the characteristics of the transistor 2 is based on model equations including threshold parameters and other physically meaningful parameters; parameters can be highly accurately extracted from measurements of the characteristics of the simulation target transistor 2.

Incidentally, when a transistor including three or more parameters $Vt_i$ with mutually different threshold value is the simulation target transistor 2 as in the present embodiment, there are more than two extraction target γ. Therefore, γ cannot be extracted for each region by a similar method to the first embodiment, specifically, by a method of obtaining from the resistance value R of the source and drain regions which are not below a gate section, the threshold parameter $Vt_i$ extracted by the Vt extraction section 41, and the V-I characteristics measured by the V-I measuring section 22 on transistors 2 differing in ideal length L in the area functioning as the channel region.

Therefore, in the simulation system 1 in accordance with the present embodiment, as will be detailed later, γ for each region is extracted from the V-I characteristics of a comparative transistor (measurement-use transistor) 4 having an "intermediate" structure between the simulation target transistor 2 and the resistance measurement transistor 3, as well as the values R, $Vt_i$ and the V-I characteristics of the transistor 2.

To describe in more detail, the comparative transistor 4 has a structure where the area functioning as the channel region of the simulation target transistor 2 is expanded to reduce the number of threshold parameters $Vt_i$ of mutually different values by one at a time. When the simulation target transistor 2, one or more comparative transistors 4 with a mutually different structure, and the resistance measurement transistor 3 are lined up, the number of threshold parameters $Vt_i$ of mutually different values is specified to decrease one at a time between adjacent transistors.

For example, as shown in FIG. 21, when an FET 101c with three threshold parameters $Vt_i$ of mutually different values is the simulation target transistor 2, the structure of the comparative transistor 4 has a structure where the p region 113b is expanded in width, in other words, where the N⁻⁻ regions 116, 117 are removed as shown in FIG. 19, so that there are two threshold parameters $Vt_i$ of mutually different values. In this case, the simulation target transistor 2 has three threshold parameters $Vt_i$ of mutually different values; therefore, there is one structure of the comparative transistor 4 (shown in FIG. 19).

In addition, similarly to the simulation target transistor 2 and the resistance measurement transistor 3, comparative transistors 4 mutually differing in the ideal length L of the area functioning as the channel region in the source-drain direction are also prepared, one for each structure.

The simulation system 1 in accordance with the present embodiment performs substantially similar steps to S1 to S7 in FIG. 7, extracting parameters for the modeling of the simulation target transistor 2 by equations (10) through (13).

In the present embodiment, similarly to FIG. 7, S1 and S2 extract the threshold parameters $Vt_i$. Here, also in the present embodiment, the threshold parameters $Vt_i$ are extracted from the measurements of the transistor capacitance by the C-V measuring section 21; therefore, all the threshold parameters $Vt_i$ can be extracted from a single measurement of the gate voltage-transistor capacitance characteristics of the transistor 2, no matter what the number of threshold parameters $Vt_i$ is.

Figure 22:
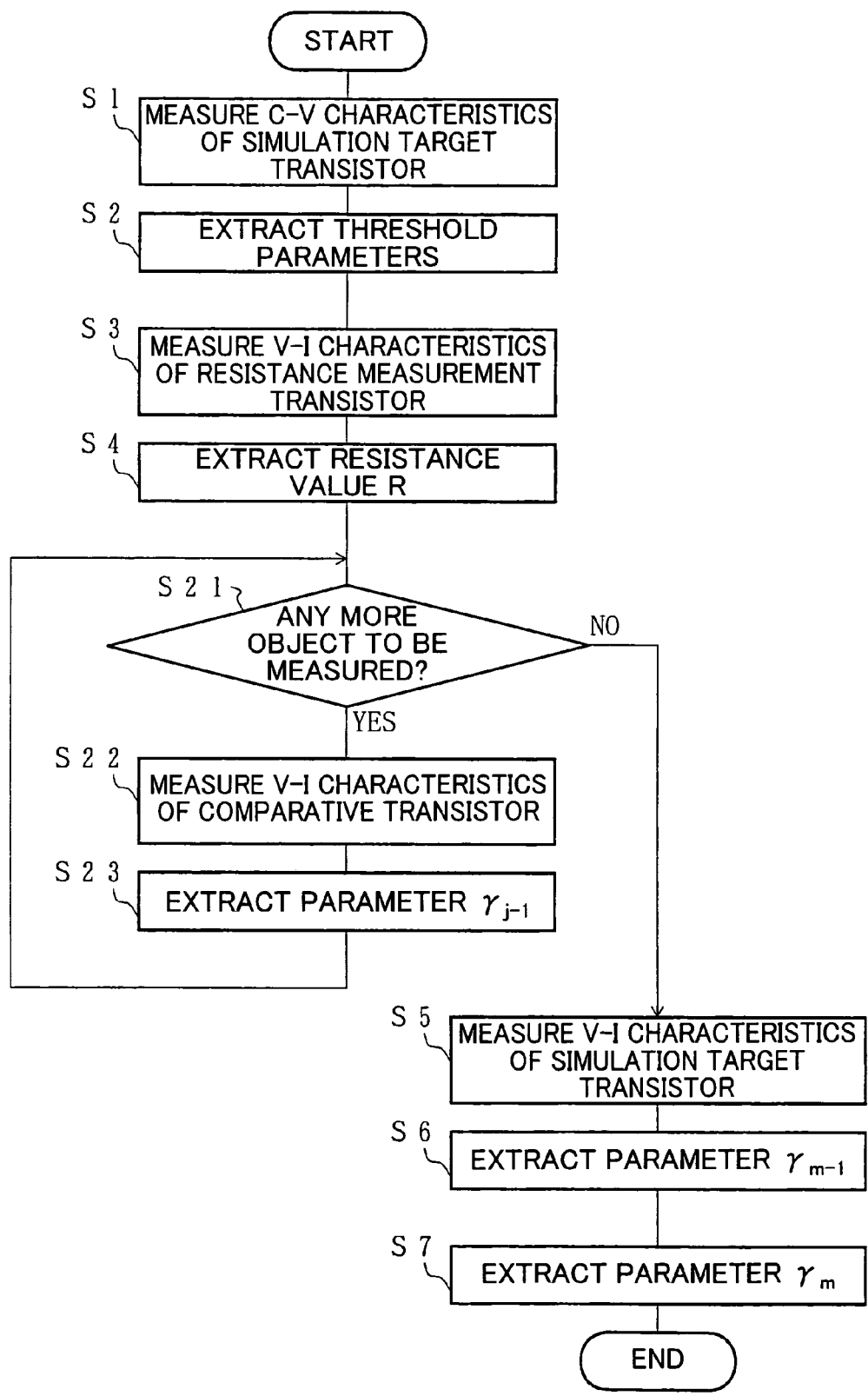
FIG. 22 is a flow diagram illustrating an operation of a simulation system in accordance with the above embodiment.

Further, the simulation system 1 in accordance with the present embodiment, as shown in FIG. 22, performs S21 through S23 of measuring the V-I characteristics of the comparative transistor 4 and extracting the parameter γ of the regions other than the area functioning as the channel region and its adjacent area based on the measurements between the step (S4) of extracting the resistance value R of the source section and the drain section not below a gate section and the step (S6) of extracting γ of the region adjacent to the area functioning as the channel region ($\gamma_{LDD}$ in the FIG. 7 case).

Specifically, the γ extraction section 42 provided in the parameter extraction section 32 of the simulator 12 measures the V-I characteristics of the comparative transistors 4 in ascending order of the number of threshold parameters $Vt_i$ of mutually different values.

If the V-I characteristics of any of the comparative transistors 4 still remain unmeasured, (YES in S21), the γ extraction section 42 in S22 instructs the V-I measuring section 22 of the measuring device 11 to measure the V-I characteristics of that comparative transistor 4.

V-I characteristics are measured for each comparative transistors 4 which mutually differ in the ideal length L of the area functioning as the channel region (p region 113b in the FIG. 19 case) in the source-drain direction. The V-I measuring section 22 repeats measurement of V-I characteristics while replacing the comparative transistor 4 being connected to the terminals T11, T12, T13.

Here, affixing the number of threshold parameters of mutually different values, as with the transistor $FET_1$ for the resistance measurement transistor 3, the transistor $FET_2$ for the comparative transistor 4, and the transistor $FET_m$ for the simulation target transistor 2 to distinguish one transistor from another, any given one ($FET_j$) of the transistors $FET_2$ to $FET_m$ is modeled similarly to equation (11), by equation (14):

$$Vd/Id = \Sigma[\gamma_i/(Vg-Vt_i)] + R \quad (14)$$

where Σ is a summation symbol with the index i from 1 to j. In equation (14), the threshold parameters $Vt_i$ represents threshold parameters due to the impurity concentration regions found in the transistor $FET_{i+1}$, but missing in the transistor $FET_i$. For example, the threshold parameter due to the impurity concentration regions found in the transistor $FET_2$, but missing in the transistor $FET_1$ is $Vt_1$, and the threshold parameter due to the impurity concentration regions found in the transistor $FET_3$, but missing in the transistor $FET_2$ is $Vt_2$. When i=j, the threshold parameter $Vt_i$ represents the threshold parameter of the transistor $FET_1$. $\gamma_i$ is the grand sum of those parameters γ in equation (11) which are for the regions where threshold parameters have equal values.

Further, rearranging equation (14), equation (15) is obtained:

$$(Vd/Id - R - \Sigma[\gamma_i/(Vg-Vt_i)]) \cdot (Vg-Vt_j) = [(Vg-Vt_{j-1})/(Vg-Vt_j)] \cdot \gamma_j + \gamma_{j-1} \quad (15)$$

where Σ on the left side is a summation symbol with the index i from 1 to j−2 for j>2 and equals 0 for j=2. $Vt_j$ and $\gamma_j$ are the threshold parameter and γ for the area functioning as the channel region.

Here, the transistors $FET_{m-1}$ to $FET_1$ have a structure where the area functioning as the channel region of the simulation target transistor 2 is expanded so as to reduce the number of threshold parameters $Vt_i$ of mutually different values by one at a time. Therefore, comparing the transistor $FET_j$ to $FET_{j-1}$, the parameters corresponding to the outside of the expanded area are equal. Specifically, the parameters $\gamma_1$ to $\gamma_{j-2}$ of the transistor $FET_j$ are respectively equal to the parameters $\gamma_1$ to $\gamma_{j-2}$ of the transistor $FET_{j-1}$, and the threshold parameters $Vt_1$ to $Vt_{j-2}$ of the transistor $FET_j$ are respectively equal to the threshold parameters $Vt_1$ to $Vt_{j-2}$ of the transistor $FET_{j-1}$.

Therefore, in S23, when the γ extraction section 42 extracts the parameter $\gamma_{j-1}$ from the V-I characteristics of a transistor $FET_j$, Σ on the left side of equation (15) can be evaluated from the already extracted parameters $\gamma_1$ to $\gamma_{j-2}$.

When the ideal length $L_j$ of the area functioning as the channel region in the source-drain direction changes, $\gamma_{j-1}$ does not change, and only $\gamma_j$, in other words, only $(L_j-$Loff$)/$(Weff·$\mu_j$·Cox) of that region changes. As a result, plotting the dependence of the left side of equation (15) on the ideal length L in the source-drain direction for each gate voltage Vg and approximating the dependence with a best fit function, the resultant lines intersect at a point, similarly to FIG. 11, provided that there exist no function errors, measurement errors, or errors due to irregularities in the manufacture of the transistors $FET_1$ to $FET_m$.

Therefore, the γ extraction section 42 can in S23 so approximate the L dependence with the function that all the curves produced by evaluating the left side of equation (15) from the V-I characteristics of the transistors $FET_j$ as measured by the V-I measuring section 22 and approximating the dependence on the ideal length L of the value of the left side with the function intersect at a single point, and extract the parameter $\gamma_{j-1}$ from the value of the left side at which the curves intersect.

As an example, the γ extraction section 42 plots the $L_j$ dependence of the value of the left side of equation (15) calculated from the V-I characteristics measurements for each gate voltage Vg and approximates the dependence with a linear function based on equation (15) so as to minimize measurement errors. Thus, the value of the left side changes linearly with $L_j$, and the intersecting points of the lines for the gate voltages Vg in practice collect at one common point. Further, the γ extraction section 42 stores, in the parameter $\gamma_{j-1}$, the y-coordinates (Ω·V) of all the intersecting points of the lines corresponding to the respective gate voltages Vg (the intersecting points for all the combinations of the lines).

As another example, when approximating those of the values of the left side of equation (15) calculated from the V-I characteristics measurements which share an equal gate voltage Vg with a linear function of the ideal length L passing through the point common for all the gate voltages Vg, the γ extraction section 42 adjusts the common point and the tilts of the linear functions to minimize measurement errors. When the common point is calculated at which measurement errors are minimum, the γ extraction section 42 may store the y-coordinates (Ω·V) of the common point as the parameter $\gamma_{j-1}$.

S21 to S23 above are repeated until there are no more comparative transistors 4 whose V-I characteristics are not measured yet. As the V-I characteristics of all the comparative transistors 4 are measured, and the parameters $\gamma_1$ to $\gamma_{m-2}$ are extracted (NO in S21), the γ extraction section 42 in S5 causes the V-I characteristics of the simulation target transistor 2 to be measured and in S6 extracts the parameter $\gamma_{m-1}$ from the V-I characteristics of the transistor 2 ($FET_m$) as measured by the V-I measuring section 22 on the basis of equation (15), similarly to S23.

As the parameters $Vt_1$ to $Vt_m$ and $\gamma_1$ to $\gamma_{m-1}$ are determined, the γ extraction section 42 in S7 calculates the parameters Loff, μ are calculated in $\gamma_m=(L_j-$Loff$)/$Weff·μ·Cox based on these values and the V-I characteristics measurements in S5 so that equation (11) best fits the V-I characteristics of the $L_j$ transistors.

In this manner, the simulation system 1 in accordance with the present embodiment extracts the parameters $\gamma_i$ in equation (14) in reference to not only the simulation target transistors 2, but the V-I characteristics measurements of the comparative transistors 4. Therefore, although the number of threshold parameters of mutually different values is greater than or equal to 3, the parameters $\gamma_i$ can be extracted which better fit the simulation target transistors 2, and the characteristics of the simulation target transistor 2 can be simulated to higher accuracy.

The foregoing description assumed as an example the FET 101c shown in FIG. 21 as the simulation target transistor 2 including three or more threshold parameters of mutually different values. This is by no means limiting.

For example, an FET laid shown in FIG. 23 may be assumed. The FET 101d had a substantially similar structure to the FET 101c in FIG. 21.

The regions 111, 112 in FIG. 23 are provided in a P$^+$ region 131 where the impurity concentration of the second conduction type is higher than in the well region 109b. Similarly, the regions 114, 115 are provided in a P$^+$ region 132. Further, the FET laid includes, in place of the N$^{--}$ regions 116, 117 shown in FIG. 21, P$^-$ regions 133, 134 where the impurity concentration of the second conduction type is lower than in the P$^+$ regions 131, 132. The well region 109b, the P$^-$ regions 133, 134, the N$^-$ regions 112, 114, and the N$^+$ regions 111, 115 are mutually different in resistance characteristics due to their respective impurity concentrations. In the FET 101d thus structured, the P$^-$ regions 133, 134 restrain the lateral expansion of the depletion layer in the N$^+$ and N$^-$ regions (111, 112/114, 115), reducing the chance of punch-throughs in bulk silicon. This provides a transistor structure resistant to short channel effects.

Whichever structure the simulation target transistor 2 may take, the simulation system 1 in accordance with the present embodiment can simulate transistors of any given structure to high accuracy by simulating the characteristics of the transistor 2 with equations (10) through (13), provided that the transistor includes areas of mutually different impurity concentrations below a gate section.

Embodiment 3

The present embodiment will describe a simulation system 1b capable of simulating the characteristics of a simulation target transistor 2 to higher accuracy than the first and second embodiments if the transistor 2 is symmetric with respect to the center line of an area functioning as a channel region.

The simulation system 1b in accordance with the present embodiment has a substantially similar structure as the simulation system 1 in FIG. 1. A transistor model 31 however models the transistor 2 with equation (16) instead of equations (5) through (8) and equations (10) through (13):

$$Rds=Vd/Id=\Sigma[\gamma_i/(Vg-Vt_i)]+\gamma_n/(Vg-Vt_n-Vd/2)+R \quad (16)$$

where the number of regions is taken as 2n−1, and Σ is a summation symbol with the index i from 1 to 2n−1, except for i=n.

In equation (16), only the term corresponding to an area which is functioning as the channel region and which is an impurity concentration region which is a primary factor of resistance variations between the source section electrode and the drain section electrode, in other words, the region $A_n$ located in the middle of the region between the source section and the drain section, has a denominator (Vg−Vt$_n$−Vd/2) instead of (Vg−Vt$_i$). This enables the simulation system 1b to simulate the characteristics of the simulation target transistor 2 to higher accuracy.

Incidentally, in the first through the third embodiments, in the present embodiment, the resistance value of an area which is functioning as the channel region and which is an impurity concentration region which is a primary factor of resistance variations between the source section electrode and the drain section electrode was modeled with Lch/[(Weff·μ·Cox)·(Vg−Vt)] or Lch/[(Weff·μ·Cox)·(Vg−Vt−Vd/2)] as examples. This is by no means limiting. The modeling may be based on any given model equation fj.

Specifically, the transistor model 31 may model the transistor 2 with equation (17) instead of equations (5) through (8) and equations (10) through (13):

$$Rds=Vd/Id=fj+\Sigma[\gamma_i/(Vg-Vt_i)]+R \quad (17)$$

where n is the number of regions, $A_1$ to $A_n$ are the regions, fj is the given model equation representing the resistance characteristics of an area in the channel region $A_j$, and Σ is a summation symbol with the index i from 1 to n, except for i=j.

Even in the arrangement above, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. The independent terms enable independent evaluation of the resistance value of the primary factor region and those of the parasitic resistance regions. As a result, despite the fact that the transistor 2 including regions of mutually different impurity concentrations below the gate section is the simulation target, the characteristics of the transistor 2, inclusive of subthreshold regions which are difficult to evaluate through actual measurement, can be simulated to high accuracy while preserving a good fit with a capacitance model.

In addition, the characteristics of the transistor 2 are simulated using a model equation including threshold parameters which has physical meanings; therefore, parameters can highly accurately be extracted from the measurements of the characteristics of the simulation target transistor 2.

Further, the parameter $Vt_i$ and $\gamma_i$ corresponding to the regions other than the channel region can be highly accurately extracted similarly to the foregoing embodiments; using these values, the parameters in modeling the channel region with the function fj can also be highly accurately extracted.

In addition, the foregoing description assumed, as an example, a model equation directly describing, with one threshold parameter, the threshold voltage of a region, i.e., the transition voltage at which the semiconductor element composed of the region and its adjacent regions changed from a range where the element exhibited such low conductance that it varied exponentially with gate voltage to a range where the element exhibited such high conductance that it varied with gate voltage more moderately than exponential variations. This is by no means limiting. Substantially similar effects are obtained from a model equation including a set of threshold parameters indirectly describing the threshold voltage.

Describing the threshold voltage with one threshold parameter as in the embodiments involves relatively small amount of calculation in the parameter extraction and the calculation of the characteristics of a transistor based on the model equation. Therefore, the simulation systems 1 to 1b can be built which can extract the parameter and calculate the characteristics of a transistor at sufficient accuracy and high speed.

Further, no matter whether modeling is based on the function fj, the embodiments assumed simulation systems which included the measuring device 11 to measure the C-V characteristics of the simulation target transistor 2 and the V-I characteristics of the simulation target transistor 2, the resistance measurement transistor 3, and the comparative transistor 4. This is by no means limiting. For example, the parameter extraction section 32 in the simulator 12 may receive, for example, inputs of results of measurement by another measuring device and extract parameters (γ, Vt, etc.) for the transistor model 31 to simulate the characteristics of the simulation target transistor 2 on the basis of the measurements.

The embodiments assumed as an example the provision of the parameter extraction section 32 in the simulation systems 1 to 1b. This is by no means limiting. The transistor model 31 may use parameters specified in advance to simulate the characteristics of the simulation target transistor 2.

However, when both the measuring device 11 and the parameter extraction section 32 are provided as in the embodiments, the parameters of the simulation target transistor 2 can be extracted from the measurements of the transistors 2 to 4 even if the simulation target transistor 2 is altered.

In addition, the embodiments assumed, as an example, that the members constituting the measuring device 11 and the simulator 12 were function blocks provided by a CPU or other computing means executing program code stored in a ROM, RAM, or like storage medium. The members may be provided by hardware performing similar processes. In addition, they may be provided by a combination of hardware performing some of the processes and computing means controlling the hardware and performing the remaining processes by way of execution of program code. Further, those of the members which were assumed to be implemented by hardware may be provided by a combination of hardware performing some of the processes and computing means controlling the hardware and performing the remaining processes by way of execution of program code. The computing means may be a single entity or provided as a set of computing means connected over internal buses and various communications paths which work together to execute the program code.

The program code itself direct executable by the computing means or a program as data from which the program code is derived by decompression or a like process (detailed later) is distributed on storage media storing the program (program code or data), transmitted through communications means transmitting over a wired or wireless communications channel, or otherwise distributed for execution by the computing means.

For transmission over a communications channel, the program is transmitted over the communications channel as a series of signals representing the program propagate through the transmission media forming the communications channel. In addition, in the transmission of a series of signals, a transmitter device may modulate a carrier wave with a series of signals representing the program so as to superimpose the series of signals onto the carrier wave. In this case, a receiver device restores the series of signals by demodulating the carrier wave. In contrast, in the transmission of the series of signals, the transmitter device may divide the series of signals as a digital data string into packets for transmission. In this case, the receiver device restores the series of signals by assembling incoming packets. In addition, in the transmission of the series of signals, the transmitter device may multiplex the series of signals and other series of signals by time division/frequency division/code division or a like technique for transmission. In this case, receiver devices restore the individual series of signals by extracting from the series of multiplex signals. In any case, similar effects are achieved provided that the program is transmitted over a communications channel.

Here, the storage medium used in the distribution of the program is preferably removable. The storage medium, however, may be either removable or irremovable after the distribution of the program. The storage medium may be either rewriteable (writeable) or non-rewriteable (non-writeable) and either volatile or involatile, and may employ any given recording method and come in any shape, provided that the medium is capable of storing the program. Examples of such storage media include tapes, such as magnetic tape and cassette tape; magnetic discs, such as floppy (registering trademark) discs and hard disks; and other discs including CD-ROMs, magneto-optical discs (MOs), mini discs (MDs), and digital video discs (DVDs). In addition, the storage medium may be a card like an IC card or an optical card or a semiconductor memory like a mask ROM, EPROM, EEPROM or flash ROM. Alternatively, the storage medium may be a memory device provided inside the CPU or other computing means.

The program code may be code which gives the computing means instructions as to all procedures of the processes. Alternatively, if there already exists a basic program (e.g., operating system or library) which can execute some or all of the processes when fetched by a predetermined procedure, some or all of the procedures may be replaced by, for example, code or a pointer instructing the computing means to fetch the basic program.

The program may be stored in the storage medium in such a form that the computing means can access the program for execution as in a real memory, such a form for installation a local storage medium (e.g., real memory or hard disk) before loading into a real memory that the computing means can always access the program, or such a form in which the program is stored in a local storage medium, for example, over a network or from a mobile storage medium before installation. In addition, the program is not limited to compiled object code. It may be stored in the form of source code or intermediate code generated during the course of interpretation or compilation. In any case, similar effects are achieved, in no matter which form the program may be stored in the storage medium, provided that the program can be converted into such a form that the computing means can execute the program by way of decompression of compressed information, decoding coded information, interpretation, compilation, linking, loading into real memory, or any combination of these processes.

As an example, when the transistor model 31 is provided with a computing engine simulating the transistor 2 in accordance with a model equation or a table stored in a storage device in advance, the computer providing the computing engine can be made to operate as the transistor model 31 in accordance with the present embodiment by feeding the model equation and the table as the program to the general-purpose computing engine.

As in the foregoing, a simulator (simulation system 1, 1b) in accordance with the present invention is a simulator including transistor characteristics calculation means (transistor model 31) calculating, from predetermined model equations, characteristics of a transistor (simulation target transistor 2) including at least three regions, a gate section, a source section, and a drain section. The transistor has a drain current between the source section and the drain section which is controllable with a gate voltage applied to the gate section. The transistor includes regions of mutually different impurity concentrations below the gate section which provides a path for the drain current. One of the model equations which represents a resistance between a source section electrode and a drain section electrode has terms representing resistance values corresponding respectively to the regions. At least two of the terms each have a threshold parameter indicating a transition voltage at which a semiconductor element composed of the associated region and regions adjacent to that region changes from a state where the element exhibits such low conductance that the resistance of the region varies exponentially with gate voltage to a state where the element exhibits such high conductance that the resistance of the region varies with gate voltage more moderately than exponential variations. The threshold parameters of the terms are specified independently from each other. The foregoing or following threshold parameters may be single parameters directly indicating a transition voltage or a set of parameters dictating the voltage, provided that the parameter(s) indicates a transition voltage.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. The independent terms enable independent evaluation of the resistance value of the primary factor region and those of the parasitic resistance regions.

In addition, the threshold parameters correspond to physical quantities of the simulation target transistor and indicate a transition voltage at which the semiconductor element changes from a state where the element exhibits such a low conductance that a resistance of the associated region varies exponentially with the gate voltage to a state where the element exhibits such a high conductance that the resistance of the associated region varies with the gate voltage more moderately than exponential variations.

As a result, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model. In addition, the characteristics of the transistor are simulated using a model equation including threshold parameters which has physical meanings; therefore, parameters can highly accurately be extracted from the measurements of the characteristics of the simulation target transistor.

On top of the arrangement above, the model equation may be $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, n is a number of the regions, $A_1$ to $A_n$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j.

According to the arrangement, the characteristics of the transistor are calculated with the model equation; the characteristics of the semiconductor element composed of an associated one of the other regions than the region $A_j$ which is a primary factor of the resistance variations and its adjacent regions can be simulated to high accuracy while maintaining a good fit with the capacitance model. Meanwhile, a function representing the characteristics of a transistor having a constant impurity concentration below a gate section may be used as the function representing the resistance characteristics of the region $A_j$ which is a primary factor of resistance variations between the source section electrode and the drain section electrode. Therefore, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model.

In addition, the characteristics of the transistor are simulated using a model equation including threshold parameters which has physical meanings; therefore, the threshold parameters for regions other than the region $A_j$ can highly accurately be extracted from the measurements of the characteristics of the simulation target transistor. Meanwhile, the parameters in the function fj can highly accurately be extracted by extracting them in reference to these threshold parameters.

On top of the arrangement, the model equation may be $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, n is a number of the regions, $A_1$ to $A_n$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, and $\Sigma$ is a summation symbol with an index i from 1 to n.

According to the arrangement, the characteristics of a transistor are calculated with the model equation. Therefore, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model. In addition, the characteristics of the transistor are simulated using a model equation including threshold parameters which has physical meanings; therefore, parameters can highly accurately be extracted from the measurements of the characteristics of the simulation target transistor.

On top of the arrangement, for those of the transistors which are symmetric with respect to a middle line between the source section and the drain section, the model equation may be $Vd/Id=\Sigma[\gamma_i/(Vg-Vt_i)]+\gamma_n/(Vg-Vt_n-Vd/2)+R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, 2n−1 is a number of the regions, $A_1$ to $A_{2n-1}$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, and $\Sigma$ is a summation symbol with an index i from 1 to 2n−1, except for i=n.

In the model equation, the term for the region, located at the middle between the source section and the drain section, which is a primary factor of resistance variations is not $\gamma_n/$ ($Vg-Vt_n$), but $\gamma_n/(Vg-Vt_n-Vd/2)$; therefore, the characteristics of a transistor which is symmetric with respect to the middle line between the source section and the drain section can be simulated to higher accuracy.

On top of the arrangement, electrical characteristics calculation means (circuit analyzing section 35) may be included which calculates electrical characteristics of a circuit including the transistor on the basis of the characteristics of the transistor as calculated by the transistor characteristics calculation means.

According to the arrangement, the characteristics of a circuit including the transistor, as well as transistor simulation, can also be simulated by the electrical characteristics calculation means, providing a simulator capable of simulation of more general circuits.

On top of the arrangement, threshold parameter setting means (Vt extraction section 41) may be included which measures characteristics of a capacitance between a first terminal connected to a gate section electrode of the transistor and a second terminal commonly connected to the source section electrode and the drain section electrode with respect to the gate voltage and specifies the threshold parameters on the basis of the measurements.

According to the arrangement, the threshold parameter setting means specifies the threshold parameter on the basis of the characteristics of the capacitance of the transistor with respect to the gate voltage. Therefore, regardless of the number of threshold parameters, a single measurement of the characteristics of the capacitance with respect to the gate voltage can extract all the threshold parameters.

On top of the arrangement, γ calculation means (γ extraction section 42) may be included which calculates $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors (comparative transistors 4) manufactured by increasing, by one at a time, the number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

In the arrangement, the γ calculation means calculates $\gamma_i$ for the regions in reference to not only the threshold parameter and the transistor's current-voltage characteristics measurements, but also the measurement-use transistor's current-voltage characteristics measurements. Therefore, the $\gamma_i$ of the regions are highly accurately extracted.

In contrast, the parameter extraction device (simulation system 1, 1b) as discussed in the foregoing, is a parameter extraction device includes parameter extraction means (32) extracting a parameter to calculate, from predetermined model equations, characteristics of a transistor (simulation target transistor 2) including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:

one of the model equations which represents a resistance between a source section electrode and a drain section electrode has terms representing resistance values corresponding respectively to the regions;

at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and the threshold parameters of the terms are specified independently from each other, wherein the parameter extraction means measures characteristics of a capacitance between a first terminal connected to a gate section electrode of the transistor and a second terminal commonly connected to the source section electrode and the drain section electrode with respect to the gate voltage, and calculates the threshold parameters on the basis of the measurements.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. Therefore, despite the fact that the transistor including regions of mutually different impurity concentrations below the gate section is the simulation target, by simulating the transistor with the model equation, the characteristics of a transistor, inclusive of subthreshold regions which are difficult to evaluate through actual measurement, can be simulated to high accuracy while preserving a good fit with a capacitance model.

In addition, the parameter extraction device extracts the threshold parameters on the basis of the characteristics of the capacitance of a transistor with respect to the gate voltage. Therefore, regardless of the number of threshold parameters, a single measurement of the characteristics of the capacitance with respect to the gate voltage can extract all the threshold parameters. Therefore, the threshold parameters included in the model equation which can simulate the characteristics of a transistor to high accuracy can readily be extracted.

On top of the arrangement, the model equation may be $Vd/Id = fj + \Sigma[\gamma_i/(Vg-Vt_i)] + R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, n is a number of the regions, $A_1$ to $A_n$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and Σ is a summation symbol with an index i from 1 to n, except for i=j, the parameter extraction device further comprising:

a γ calculation means (γ extraction section 42) calculating $\gamma_i$ for the regions, except for the region $A_j$, from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors; and a function parameter extraction means (γ extraction section 42) extracting a parameter of the function fj in reference to the threshold parameters and $\gamma_i$ for the regions, except for the region $A_j$.

According to the arrangement, the γ calculation means calculates the $\gamma_i$ of the regions other than the region $A_j$ in reference to not only the threshold parameter and the transistor's current-voltage characteristics measurements, but also the measurement-use transistor's current-voltage characteristics measurements. Therefore, the $\gamma_i$ of the regions are highly accurately extracted. In addition, the function parameter extraction means extracts a parameter of the function fj with reference to these threshold parameter and $\gamma_i$; therefore, the parameters in the function fj is also highly accurately extracted.

On top of the arrangement, the model equation may be $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, n is a number of the regions, $A_1$ to $A_n$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, and $\Sigma$ is a summation symbol with an index i from 1 to n, the parameter extraction device further comprising γ calculation means (γ extraction section 42) calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

According to the arrangement, the γ calculation means calculates the $\gamma_i$ of the regions in reference to not only the threshold parameter and the transistor's current-voltage characteristics measurements, but also the measurement-use transistor's current-voltage characteristics measurements. Therefore, the $\gamma_i$ of the regions are highly accurately extracted.

On top of the arrangement, for those of the transistors which are symmetric with respect to a middle line between the source section and the drain section, the model equation may be $Vd/Id=\Sigma[\gamma_i/(Vg-Vt_i)]+\gamma_n/(Vg-Vt_n-Vd/2)+R$ where Vd is a voltage between the source section electrode and the drain section electrode, Id is a current between the source section electrode and the drain section electrode, Vg is a voltage between a gate section electrode and the source section electrode, R is a resistance of the source section and the drain section which are not below the gate section, 2n−1 is a number of the regions, $A_1$ to $A_{2n-1}$ are the regions, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, and $\Sigma$ is a summation symbol with an index i from 1 to 2n−1, except for i=n, the parameter extraction device further comprising a γ calculation means (γ extraction section 42) calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

According to the arrangement, the term for the region, located at the middle between the source section and the drain section, which is a primary factor of resistance variations is not $\gamma_n/(Vg-Vt_n)$, but $\gamma_n/(Vg-Vt_n-Vd/2)$; therefore, the characteristics of a transistor which is symmetric with respect to the middle line between the source section and the drain section can be simulated to higher accuracy by simulating the transistor with the model equation.

Further, the γ calculation means calculates the $\gamma_i$ of the regions in reference to not only the threshold parameter and the transistor's current-voltage characteristics measurements, but also the measurement-use transistor's current-voltage characteristics measurements. Therefore, $\gamma_i$ of the regions can be highly accurately extracted which is included in the model equation which can simulate the characteristics of a transistor which is symmetric to the middle line between the source section and the drain section to higher accuracy.

A transistor simulation method as discussed in the foregoing, is a transistor simulation method including the transistor characteristics calculation step of calculating, from predetermined model equations, characteristics of a transistor (simulation target transistor 2) including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current, wherein:
one of the model equations which represents a resistance between a source section electrode and a drain section electrode has terms representing resistance values corresponding respectively to the regions;
at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and
the threshold parameters of the terms are specified independently from each other.

According to the arrangement, when regarding the channel region as a primary factor of resistance variations between the source section electrode and the drain section electrode of the transistor and the other regions providing parasitic resistance, the terms corresponding respectively to the primary factor region and the parasitic resistance regions include threshold parameters which are set independently from each other. Therefore, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model.

A parameter extraction method in accordance with the present invention, as discussed in the foregoing, characteristics of a transistor (simulation target transistor 2) including at least three regions, a gate section, a source section, and a drain section, the transistor having a drain current between the source section and the drain section which is controllable with a gate voltage applied to the gate section, the transistor including regions of mutually different impurity concentrations below the gate section which provides a path for the drain current,
wherein:
one of the model equations which represents a resistance between a source section electrode and a drain section electrode has terms representing resistance values corresponding respectively to the regions;
at least two of the terms each have a threshold parameter indicating a transition voltage at which a semiconductor element composed of the associated region and regions adjacent to that region changes from a state where the element exhibits such a low conductance that a resistance of the associated region varies exponentially with the gate voltage to a state where the element exhibits such a high conductance that the resistance of the associated region varies with the gate voltage more moderately than exponential variations; and
the threshold parameters of the terms are specified independently from each other,
wherein
the parameter extraction step includes the steps of measuring characteristics of a capacitance between a first terminal connected to a gate section electrode of the transistor and a second terminal commonly connected to the source section electrode and the drain section electrode with respect to the gate voltage, and calculating the threshold parameters on the basis of the measurements.

According to the arrangement, the threshold parameters are extracted on the basis of the characteristics of the capacitance of a transistor with respect to the gate voltage. Therefore, regardless of the number of threshold parameters, a single measurement of the characteristics of the capacitance with respect to the gate voltage can extract all the threshold parameters. Therefore, the threshold parameters included in the model equation which can simulate the characteristics of a transistor to high accuracy can readily be extracted.

Incidentally, the simulator and the parameter extraction device may be provided in the form of hardware. Alternatively, they may be provided in the form of a program executed on a computer.

Specifically, a program in accordance with an embodiment of the present invention causes a computer to operate as individual means of the simulator. In addition, a storage medium in accordance with an embodiment of the present invention contains the program.

A computer, running these programs, function as the simulator. Therefore, as with the simulator, despite the fact that the transistor including regions of mutually different impurity concentrations below the gate section is the simulation target, the characteristics of a transistor, inclusive of subthreshold regions which are difficult to evaluate through actual measurement, can be simulated to high accuracy while preserving a good fit with a capacitance model.

The program in accordance with the present invention causes a computer to operate as individual means of the parameter extraction device. In addition, a storage medium in accordance with the present invention contains the program.

A computer, running these programs, function as the parameter extraction device. Therefore, as with the parameter extraction device, the threshold parameters included in the model equation which can simulate the characteristics of a transistor to high accuracy can readily be extracted.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A simulation system, comprising a transistor characteristics calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;
the threshold parameters of the terms are specified independently from each other;
the threshold parameter is included in the terms corresponding respectively to a region as a primary factor of resistance variations between the source section electrode and the drain section electrode of the transistor and to the other regions; and the model equation is $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j, and wherein the characteristics of the transistor which are calculated from the model equations are outputted by an output section of the simulation system to a display where the characteristics of the transistor are displayed on the display.

2. The simulation system as set forth in claim 1, further comprising a γ calculation section calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

3. The simulation system as set forth in claim 1, further comprising an electrical characteristics calculation section calculating electrical characteristics of a circuit including the transistor on the basis of the characteristics of the transistor as calculated by the transistor characteristics calculation section.

4. The simulation system as set forth in claim 1, further comprising a threshold parameter setting section measuring characteristics of a capacitance between a first terminal connected to a gate section electrode of the transistor and a second terminal commonly connected to the source section electrode and the drain section electrode with respect to the gate voltage, and specifying the threshold parameters on the basis of the measurements.

5. A simulation system, comprising a transistor characteristics calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;
the threshold parameters of the terms are specified independently from each other;
the threshold parameter is included in the terms corresponding respectively to a region as a primary factor of resistance variations between the source section electrode and the drain section electrode of the transistor and to the other regions; and the model equation is $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/W_i \cdot \mu_i \cdot Cox_i)$, $Vt_i$ is a threshold parameter, and $\Sigma$ is a summation symbol with an index i from 1 to n, and wherein the characteristics of the transistor which are calculated from the model equations are outputted by an output section of the simulation system to a display where the characteristics of the transistor are displayed on the display.

6. The simulation system as set forth in claim 5, further comprising a γ calculation section calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

7. The simulation system as set forth in claim 5, further comprising an electrical characteristics calculation section calculating electrical characteristics of a circuit including the transistor on the basis of the characteristics of the transistor as calculated by the transistor characteristics calculation section.

8. The simulation system as set forth in claim 5, further comprising a threshold parameter setting section measuring characteristics of a capacitance between a first terminal connected to a gate section electrode of the transistor and a second terminal commonly connected to the source section electrode and the drain section electrode with respect to the gate voltage, and specifying the threshold parameters on the basis of the measurements.

9. A simulation system, comprising a transistor characteristics calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;
the threshold parameters of the terms are specified independently from each other;
the threshold parameter is included in the terms corresponding respectively to a region as a primary factor of resistance variations between the source section electrode and the drain section electrode of the transistor and to the other regions; and
if the transistor is symmetric with respect to a middle line between the source section and the drain section, the model equation is $Vd/Id=\Sigma[\gamma_i/(Vg-Vt_i)]\gamma_n/(Vg-Vt_n-Vd/2)+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section,
wherein the regions comprise 2n−1 regions $A_i$ with an index i running from 1 to 2n−1, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, and $Vt_i$ is a threshold parameter, and $\Sigma$ is a summation symbol with an index i from 1 to 2n−1, except for i=n, and
wherein the characteristics of the transistor which are calculated from the model equations are outputted by an output section of the simulation system to a display where the characteristics of the transistor are displayed on the display.

10. The simulation system as set forth in claim 9, further comprising
a γ calculation section calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

11. The simulation system as set forth in claim 9, further comprising an electrical characteristics calculation section calculating electrical characteristics of a circuit including the transistor on the basis of the characteristics of the transistor as calculated by the transistor characteristics calculation section.

12. The simulation system as set forth in claim 9, further comprising a threshold parameter setting section measuring characteristics of a capacitance between a first terminal connected to a gate section electrode of the transistor and a second terminal commonly connected to the source section electrode and the drain section electrode with respect to the gate voltage, and specifying the threshold parameters on the basis of the measurements.

13. A parameter extraction device, comprising a parameter extraction section extracting a parameter to calculate, from model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, where a measurement section is coupled to the parameter extraction section,
wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and
the threshold parameters of the terms are specified independently from each other,
wherein
the measurement section measures characteristics of a capacitance between a first terminal connected to a gate section electrode of the transistor and a second terminal commonly connected to the source section electrode and the drain section electrode with respect to the gate voltage, and the parameter extraction section calculates the threshold parameters on the basis of the measurements;
the threshold parameter is included in the terms corresponding respectively to a region as a primary factor of resistance variations between the source section electrode and the drain section electrode of the transistor and to the other regions; and the model equation is $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j, said parameter extraction device further comprising:

a $\gamma$ calculation section calculating $\gamma_i$ for the regions, except for the region $A_j$, from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors; and a function parameter extraction section extracting a parameter of the function fj in reference to the threshold parameters and $\gamma_i$ for the regions, except for the region $A_j$.

14. A parameter extraction device, comprising a parameter extraction section extracting a parameter to calculate, from model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, where a measurement section is coupled to the parameter extraction section, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and the threshold parameters of the terms are specified independently from each other, wherein the measurement section measures characteristics of a capacitance between a first terminal connected to a gate section electrode of the transistor and a second terminal commonly connected to the source section electrode and the drain section electrode with respect to the gate voltage, and the parameter extraction section calculates the threshold parameters on the basis of the measurements;

the threshold parameter is included in the terms corresponding respectively to a region as a primary factor of resistance variations between the source section electrode and the drain section electrode of the transistor and to the other regions; and the model equation is $Vd/Id = \Sigma[\gamma_i/(Vg - Vt_i)] + R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, and $Vt_i$ is a threshold parameter, and $\Sigma$ is a summation symbol with an index i from 1 to n, said parameter extraction device further comprising a $\gamma$ calculation section calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

15. A parameter extraction device, comprising a parameter extraction section extracting a parameter to calculate, from model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, a measurement section is coupled to the parameter extraction section, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and the threshold parameters of the terms are specified independently from each other, wherein
the measurement section measures characteristics of a capacitance between a first terminal connected to a gate section electrode of the transistor and a second terminal commonly connected to the source section electrode and the drain section electrode with respect to the gate voltage, and the parameter extraction section calculates the threshold parameters on the basis of the measurements;
the threshold parameter is included in the terms corresponding respectively to a region as a primary factor of resistance variations between the source section electrode and the drain section electrode of the transistor and to the other regions; and
if the transistor is symmetric with respect to a middle line between the source section and the drain section, the model equation is $Vd/Id=\Sigma[\gamma_i/(Vg-Vt_i)]+\gamma_n/(Vg-Vt_n-Vd/2)+R$
where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section,
wherein the regions comprise 2n−1 regions A with an index i running from 1 to 2n−1, $L_i$ is a length of one of the regions, $A_i$, in a source-drain direction, $W_i$ is a width, $\mu_i$ s a moving carrier mobility, $Cox_i$ is an oxide film capacitance density, $\gamma_i=L_i/(W_i\cdot\mu_i\cdot Cox_i)$, $Vt_i$ is a threshold parameter, and Σ is a summation symbol with an index i from 1 to 2n−1, except for i=n,
said parameter extraction device further comprising a γ calculation section calculating $\gamma_i$ for the regions from the threshold parameters and measurements of characteristics of the current between the source section electrode and the drain section electrode with respect to the voltage between the source section electrode and the drain section electrode, the measurements being made on the transistor and measurement-use transistors manufactured by increasing, by one at a time, a number of the regions of the transistor which are replaced by a region which is a primary factor of resistance variations between the source section electrode and the drain section electrode until there are no more regions other than the source section and the drain section which are not below the gate section, with mutually different gate voltages being applied to the transistor and the measurement-use transistors.

16. A simulation method, comprising the steps of:
calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
representing with one of the model equations a resistance between a source section electrode and a drain section electrode having terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and
specifying the threshold parameters of the terms independently from each other;
wherein the threshold parameter is included in the terms corresponding respectively to a region as a primary factor of resistance variations between the source section electrode and the drain section electrode of the transistor and to the other regions;

the model equation is $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section; and
wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i\cdot\mu_i\cdot Cox_i)$, $Vt_i$ is a threshold parameter, fj is a function representing resistance characteristics of one of the regions, $A_j$, which is a primary factor of resistance variations between the source section electrode and the drain section electrode, and Σ is a summation symbol with an index i from 1 to n, except for i=j.

17. A parameter extraction method, comprising the steps of:
extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
representing with one of the model equations a resistance between a source section electrode and a drain section electrode having terms associated with each of the regions and representing resistance values corresponding to the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and
specifying the threshold parameters of the terms independently from each other,
wherein
said step of extracting a parameter includes the steps of measuring characteristics of a capacitance between a first terminal connected to a gate section electrode of the transistor and a second terminal commonly connected to the source section electrode and the drain section electrode with respect to the gate voltage, and calculating the threshold parameters on the basis of the measurements;
wherein the threshold parameter is included in the terms corresponding respectively to a region as a primary factor of resistance variations between the source section electrode and the drain section electrode of the transistor and to the other regions;

the model equation is $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and
wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, and $\Sigma$ is a summation symbol with an index i from 1 to n.

18. A computer-readable storage medium stored thereon a program causing a computer to operate as a calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;
the threshold parameters of the terms are specified independently from each other; and
the threshold parameter is included in the terms corresponding respectively to a region as a primary factor of resistance variations between the source section electrode and the drain section electrode of the transistor and to the other regions;

the model equation is $Vd/Id=\Sigma[\gamma_i Vg-Vt_i)]\gamma_n/(Vg-Vt_n-Vd/2+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section;
wherein the regions comprise 2n−1 regions A with an index i running from 1 to 2n−1, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, and $Vt_i$ is a threshold parameter, and $\Sigma$ is a summation symbol with an index i from 1 to 2n−1, except for i=n.

19. A computer-readable storage medium stored thereon a program causing a computer to operate as a parameter extraction section extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
wherein:
one of the model equations represents a resistance between a source section electrode and a drain section electrode and has terms associated with each of the regions and representing resistance values of the regions;
at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and
the threshold parameters of the terms are specified independently from each other,
wherein
the parameter extraction section measures characteristics of a capacitance between a first terminal connected to a gate section electrode of the transistor and a second terminal commonly connected to the source section electrode and the drain section electrode with respect to the gate voltage, and calculates the threshold parameters on the basis of the measurements;
the threshold parameter is included in the terms corresponding respectively to a region as a primary factor of resistance variations between the source section electrode and the drain section electrode of the transistor and to the other regions;

the model equation is $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and
wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j.

20. A simulation method, comprising the steps of:
calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current,
representing with one of the model equations a resistance between a source section electrode and a drain section electrode having terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and specifying the threshold parameters of the terms independently from each other;

wherein the threshold parameter is included in the terms corresponding respectively to a region as a primary factor of resistance variations between the source section electrode and the drain section electrode of the transistor and to the other regions;

the model equation is $Vd/Id = \Sigma[\gamma_i/(Vg-Vt_i)] + R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, $Vt_i$ is a threshold parameter, and $\Sigma$ is a summation symbol with an index i from 1 to n.

21. A simulation method, comprising the steps of:

calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, representing with one of the model equations a resistance between a source section electrode and a drain section electrode having terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and specifying the threshold parameters of the terms independently from each other;

wherein the threshold parameter is included in the terms corresponding respectively to a region as a primary factor of resistance variations between the source section electrode and the drain section electrode of the transistor and to the other regions;

the model equation is $Vd/Id = \Sigma[\gamma_i/(Vg-Vt_i)] + \gamma_n/(Vg-Vt_n-Vd/2) + R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section;

wherein the regions comprise 2n−1 regions A with an index i running from 1 to 2n−1, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, and $Vt_i$ is a threshold parameter, and $\Sigma$ is a summation symbol with an index i from 1 to 2n−1, except for i=n.

22. A parameter extraction method, comprising the steps of:

extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, representing with one of the model equations a resistance between a source section electrode and a drain section electrode having terms associated with each of the regions and representing resistance values corresponding to the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and specifying the threshold parameters of the terms independently from each other, wherein said step of extracting a parameter includes the steps of measuring characteristics of a capacitance between a first terminal connected to a gate section electrode of the transistor and a second terminal commonly connected to the source section electrode and the drain section electrode with respect to the gate voltage, and calculating the threshold parameters on the basis of the measurements;

wherein the threshold parameter is included in the terms corresponding respectively to a region as a primary factor of resistance variations between the source section electrode and the drain section electrode of the transistor and to the other regions;

the model equation is $Vd/Id = fj + \Sigma[\gamma_i/(Vg-Vt_i)] + R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section; and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i = L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j.

23. A parameter extraction method, comprising the steps of:

extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, representing with one of the model equations a resistance between a source section electrode and a drain section electrode having terms associated with each of the regions and representing resistance values corresponding to the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and specifying the threshold parameters of the terms independently from each other, wherein said step of extracting a parameter includes the steps of measuring characteristics of a capacitance between a first terminal connected to a gate section electrode of the transistor and a second terminal commonly connected to the source section electrode and the drain section electrode with respect to the gate voltage, and calculating the threshold parameters on the basis of the measurements;

wherein the threshold parameter is included in the terms corresponding respectively to a region as a primary factor of resistance variations between the source section electrode and the drain section electrode of the transistor and to the other regions;

the model equation is $Vd/Id=\Sigma[\gamma_i/(Vg-Vt_i)]+\gamma_n/(Vg-Vt_n-Vd/2)+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section;

wherein the regions comprise 2n−1 regions A with an index i running from 1 to 2n−1, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, and $Vt_i$ is a threshold parameter, and $\Sigma$ is a summation symbol with an index i from 1 to 2n−1, except for i=n.

24. A computer-readable storage medium stored thereon a program causing a computer to operate as a calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;

the threshold parameters of the terms are specified independently from each other; and the threshold parameter is included in the terms corresponding respectively to a region as a primary factor of resistance variations between the source section electrode and the drain section electrode of the transistor and to the other regions;

the model equation is $Vd/Id=fj+\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section; and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i \cdot \mu_i \cdot Cox_i)$, $Vt_i$ is a threshold parameter, fj is a function representing resistance characteristics of one of the regions, $A_j$, which is a primary factor of resistance variations between the source section electrode and the drain section electrode, and $\Sigma$ is a summation symbol with an index i from 1 to n, except for i=j.

25. A computer-readable storage medium stored thereon a program causing a computer to operate as a calculation section calculating, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state;

the threshold parameters of the terms are specified independently from each other; and the threshold parameter is included in the terms corresponding respectively to a region as a primary factor of resistance variations between the source section electrode and the drain section electrode of the transistor and to the other regions;

the model equation is $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i\cdot\mu_i\cdot Cox_i)$, $Vt_i$ is a threshold parameter, and $\Sigma$ is a summation symbol with an index i from 1 to n.

26. A computer-readable storage medium stored thereon a program causing a computer to operate as a parameter extraction section extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and the threshold parameters of the terms are specified independently from each other, wherein the parameter extraction section measures characteristics of a capacitance between a first terminal connected to a gate section electrode of the transistor and a second terminal commonly connected to the source section electrode and the drain section electrode with respect to the gate voltage, and calculates the threshold parameters on the basis of the measurements;

the threshold parameter is included in the terms corresponding respectively to a region as a primary factor of resistance variations between the source section electrode and the drain section electrode of the transistor and to the other regions;

the model equation is $Vd/Id=\Sigma[\gamma_i/(Vg-Vt_i)]+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section, and wherein the regions comprise n regions A identified with an index i running from 1 to n, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i\cdot\mu_i\cdot Cox_i)$, $Vt_i$ is a threshold parameter, and $\Sigma$ is a summation symbol with an index i from 1 to n.

27. A computer-readable storage medium stored thereon a program causing a computer to operate as a parameter extraction section extracting a parameter to calculate, from predetermined model equations, characteristics of a transistor including a gate section, a source section, and a drain section, the transistor having a drain current between the source section and the drain section controllable with a gate voltage applied to the gate section, the transistor including regions of mutually different impurity concentrations below the gate section providing a path for the drain current, wherein:

one of the model equations represents a resistance between a source section electrode and a drain section electrode and has terms associated with each of the regions and representing resistance values of the regions;

at least two of the terms each have a threshold parameter indicating a transition voltage at which a semiconductor element including the associated region and regions adjacent to the associated region changes from a first state where the element exhibits a lower conductance than a second state that a resistance of the associated region varies exponentially with the gate voltage to the second state where the element exhibits a higher conductance than the first state; and the threshold parameters of the terms are specified independently from each other, wherein the parameter extraction section measures characteristics of a capacitance between a first terminal connected to a gate section electrode of the transistor and a second terminal commonly connected to the source section electrode and the drain section electrode with respect to the gate voltage, and calculates the threshold parameters on the basis of the measurements;

the threshold parameter is included in the terms corresponding respectively to a region as a primary factor of resistance variations between the source section electrode and the drain section electrode of the transistor and to the other regions;

the model equation is $Vd/Id=\Sigma[\gamma_i/(Vg-Vt_i)]+\gamma_n/(Vg-Vt_n-Vd/2)+R$ where Vd is a voltage between the source section electrode and the drain section electrode, Id is a current between the source section electrode and the drain section electrode, Vg is a voltage between a gate section electrode and the source section electrode, and R is a resistance of the source section and the drain section which are not below the gate section;

wherein the regions comprise 2n−1 regions A with an index i running from 1 to 2n−1, $L_i$ is a length of one of the regions, $A_i$, in a source-drain direction, $W_i$ is a width, $\mu_i$ is a moving carrier mobility, $Cox_i$ is an oxide film capacitance density, $\gamma_i=L_i/(W_i\cdot\mu_i\cdot Cox_i)$, and $Vt_i$ is a threshold parameter, and $\Sigma$ is a summation symbol with an index i from 1 to 2n−1, except for i=n.

* * * * *

UNITED STATES PATENT AND TRADEMARK OFFICE
CERTIFICATE OF CORRECTION

PATENT NO.        : 7,711,526 B2
APPLICATION NO.   : 10/891083
DATED             : May 4, 2010
INVENTOR(S)       : Kazuhiro Maeda et al.

It is certified that error appears in the above-identified patent and that said Letters Patent is hereby corrected as shown below:

On the title page Item (73) Assignees, please change the names of the Assignees as follows (with the changes being shown in bold):

Sharp Kabushiki Kaisha, Osaka (JP)

should read

--Sharp Kabushiki Kaisha, Osaka (JP)

TANIGUCHI, Kenji, Suita (JP)--

Signed and Sealed this
Fifth Day of July, 2011

David J. Kappos
*Director of the United States Patent and Trademark Office*